(12) United States Patent
Edwards et al.

(10) Patent No.: US 10,645,847 B2
(45) Date of Patent: May 5, 2020

(54) COOLING ELECTRONIC DEVICES IN A DATA CENTER

(71) Applicant: Google LLC, Mountain View, CA (US)

(72) Inventors: William Edwards, Mountain View, CA (US); Madhusudan Krishnan Iyengar, Foster City, CA (US); Sundar Rajan, Mountain View, CA (US); Jorge Padilla, Union City, CA (US); Norman Paul Jouppi, Palo Alto, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/958,567

(22) Filed: Apr. 20, 2018

(65) Prior Publication Data

US 2019/0327860 A1    Oct. 24, 2019

(51) Int. Cl.
*H05K 7/20*    (2006.01)

(52) U.S. Cl.
CPC ..... *H05K 7/20836* (2013.01); *H05K 7/20809* (2013.01)

(58) Field of Classification Search
None
See application file for complete search history.

(56) References Cited

U.S. PATENT DOCUMENTS

| | | | |
|---|---|---|---|
| 5,774,334 A | 6/1998 | Kawamura | |
| 6,292,365 B1 | 9/2001 | Ashiwake | |
| 6,317,326 B1 | 11/2001 | Vogel | |
| 6,388,882 B1 | 5/2002 | Hoover et al. | |
| 6,952,346 B2 | 10/2005 | Tilton et al. | |
| 6,973,801 B1 | 12/2005 | Campbell et al. | |
| 7,086,247 B2 | 8/2006 | Campbell et al. | |
| 7,233,494 B2 | 6/2007 | Campbell et al. | |
| 7,272,005 B2 | 9/2007 | Campbell et al. | |
| 7,274,566 B2 | 9/2007 | Campbell et al. | |
| 7,277,283 B2 | 10/2007 | Campbell et al. | |
| 7,298,617 B2 | 11/2007 | Campbell et al. | |
| 7,298,618 B2 | 11/2007 | Campbell et al. | |

(Continued)

OTHER PUBLICATIONS

Alavi et al. "Fabrications of microchannels by laser machining and anisotropic," Sensor and Actuators A: Physical, vol. 32, Issues 1-3, Apr. 1992, 4 pages.

(Continued)

*Primary Examiner* — Courtney L Smith
(74) *Attorney, Agent, or Firm* — Fish & Richardson P.C.

(57) ABSTRACT

A data center cooling system includes a server rack subassembly that includes a motherboard mounted on a support member and a heat generating electronic devices mounted on the a motherboard; a cold plate positioned in thermal communication with at least a portion of the heat generating electronic devices, the cold plate configured to receive a flow of a cooling liquid circulated through a supply conduit fluidly coupled to a liquid inlet of the cold plate, through the cold plate, and through a return conduit fluidly coupled to a liquid outlet of the cold plate; and a modulating control valve attached to either of the motherboard or the support member and positioned in either of the supply conduit or the return conduit, the modulating control valve configured to adjust a rate of the flow of the cooling liquid based on an operating condition of at least one of the heat generating electronic devices.

34 Claims, 10 Drawing Sheets

(56) References Cited

U.S. PATENT DOCUMENTS

| | | | |
|---|---|---|---|
| 7,301,770 | B2 | 11/2007 | Campbell et al. |
| 7,349,213 | B2 | 3/2008 | Campbell et al. |
| 7,362,574 | B2 | 4/2008 | Campbell et al. |
| 7,375,962 | B2 | 5/2008 | Campbell et al. |
| 7,380,409 | B2 | 6/2008 | Campbell et al. |
| 7,385,817 | B2 | 6/2008 | Campbell et al. |
| 7,400,504 | B2 | 7/2008 | Campbell et al. |
| 7,400,505 | B2 | 7/2008 | Campbell et al. |
| 7,405,936 | B1 | 7/2008 | Campbell et al. |
| 7,408,776 | B2 | 8/2008 | Campbell et al. |
| 7,420,808 | B2 | 9/2008 | Campbell et al. |
| 7,450,385 | B1 | 11/2008 | Campbell et al. |
| 7,486,514 | B2 | 2/2009 | Campbell et al. |
| 7,511,957 | B2 | 3/2009 | Campbell et al. |
| 7,516,776 | B2 | 4/2009 | Bezama et al. |
| 7,518,871 | B2 | 4/2009 | Campbell et al. |
| 7,593,227 | B2 * | 9/2009 | Campbell .......... H05K 7/20772 251/250 |
| 7,609,519 | B2 | 10/2009 | Campbell et al. |
| 7,639,498 | B2 | 12/2009 | Campbell et al. |
| 7,639,499 | B1 | 12/2009 | Campbell et al. |
| 7,641,101 | B2 | 1/2010 | Campbell et al. |
| 7,651,260 | B2 | 1/2010 | Hamann et al. |
| 7,665,325 | B2 | 3/2010 | Campbell et al. |
| 7,724,524 | B1 | 5/2010 | Campbell et al. |
| 7,731,079 | B2 | 6/2010 | Campbell et al. |
| 7,762,314 | B2 | 7/2010 | Campbell et al. |
| 7,787,248 | B2 | 8/2010 | Campbell et al. |
| 7,791,882 | B2 | 9/2010 | Chu et al. |
| 7,808,781 | B2 | 10/2010 | Colgan et al. |
| 7,830,664 | B2 | 11/2010 | Campbell et al. |
| 7,841,385 | B2 | 11/2010 | Campbell et al. |
| 7,885,074 | B2 | 2/2011 | Campbell et al. |
| 7,905,096 | B1 | 3/2011 | Campbell et al. |
| 7,907,406 | B1 * | 3/2011 | Campbell .............. H05K 7/202 165/104.33 |
| 7,916,483 | B2 | 3/2011 | Campbell et al. |
| 7,948,757 | B2 | 5/2011 | Campbell et al. |
| 7,963,119 | B2 | 6/2011 | Campbell et al. |
| 7,965,509 | B2 | 6/2011 | Campbell et al. |
| 7,967,062 | B2 | 6/2011 | Campbell et al. |
| 7,978,472 | B2 | 7/2011 | Campbell et al. |
| 7,978,473 | B2 | 7/2011 | Campbell et al. |
| 7,990,709 | B2 | 8/2011 | Campbell et al. |
| 7,992,627 | B2 | 8/2011 | Bezama et al. |
| 8,014,150 | B2 | 9/2011 | Campbell et al. |
| 8,018,720 | B2 | 9/2011 | Campbell et al. |
| 8,027,162 | B2 | 9/2011 | Campbell et al. |
| 8,029,186 | B2 | 10/2011 | Hamann et al. |
| 8,038,343 | B2 | 10/2011 | Hamann et al. |
| 8,051,897 | B2 | 11/2011 | Campbell et al. |
| 8,056,615 | B2 | 11/2011 | Downing |
| 8,059,405 | B2 | 11/2011 | Campbell et al. |
| 8,077,462 | B2 | 12/2011 | Barringer et al. |
| 8,094,453 | B2 | 1/2012 | Campbell et al. |
| 8,144,467 | B2 | 3/2012 | Campbell et al. |
| 8,179,674 | B2 | 5/2012 | Carter et al. |
| 8,179,677 | B2 | 5/2012 | Campbell et al. |
| 8,189,334 | B2 | 5/2012 | Campbell et al. |
| 8,194,406 | B2 | 6/2012 | Campbell et al. |
| 8,203,842 | B2 | 6/2012 | Campbell et al. |
| 8,208,258 | B2 | 6/2012 | Campbell et al. |
| 8,210,741 | B2 | 7/2012 | Hamann et al. |
| 8,230,906 | B2 | 7/2012 | Campbell et al. |
| 8,248,801 | B2 | 8/2012 | Campbell et al. |
| 8,266,802 | B2 | 9/2012 | Campbell et al. |
| 8,274,790 | B2 | 9/2012 | Campbell et al. |
| 8,279,597 | B2 | 10/2012 | El-Essawy et al. |
| 8,322,029 | B2 | 12/2012 | Campbell et al. |
| 8,322,154 | B2 | 12/2012 | Campbell et al. |
| 8,345,423 | B2 | 1/2013 | Campbell et al. |
| 8,358,503 | B2 | 1/2013 | Carter et al. |
| 8,369,091 | B2 | 2/2013 | Campbell et al. |
| 8,387,249 | B2 | 3/2013 | Campbell et al. |
| 8,437,129 | B2 * | 5/2013 | Tung .................. H05K 7/20781 165/80.4 |
| 8,472,182 | B2 | 6/2013 | Campbell et al. |
| 8,490,679 | B2 | 7/2013 | Campbell et al. |
| 8,493,738 | B2 | 7/2013 | Chainer et al. |
| 8,547,692 | B2 | 10/2013 | El-Essawy et al. |
| 8,564,952 | B2 | 10/2013 | Campbell et al. |
| 8,583,290 | B2 | 11/2013 | Campbell et al. |
| 8,619,425 | B2 | 12/2013 | Campbell et al. |
| 8,636,406 | B2 | 1/2014 | Hamann et al. |
| 8,649,177 | B2 | 2/2014 | Chainer et al. |
| 8,687,364 | B2 | 4/2014 | Chainer et al. |
| 8,689,861 | B2 | 4/2014 | Campbell et al. |
| 8,711,563 | B2 | 4/2014 | Campbell et al. |
| 8,713,955 | B2 | 5/2014 | Campbell et al. |
| 8,713,957 | B2 | 5/2014 | Campbell et al. |
| 8,739,406 | B2 | 6/2014 | Campbell et al. |
| 8,743,545 | B2 | 6/2014 | Campbell et al. |
| 8,760,863 | B2 | 6/2014 | Campbell et al. |
| 8,783,052 | B2 | 7/2014 | Campbell et al. |
| 8,789,385 | B2 | 7/2014 | Campbell et al. |
| 8,797,740 | B2 | 8/2014 | Campbell et al. |
| 8,806,749 | B2 | 8/2014 | Campbell et al. |
| 8,813,515 | B2 | 8/2014 | Campbell et al. |
| 8,817,465 | B2 | 8/2014 | Campbell et al. |
| 8,817,474 | B2 | 8/2014 | Campbell et al. |
| 8,824,143 | B2 | 9/2014 | Campbell et al. |
| 8,833,096 | B2 | 9/2014 | Campbell et al. |
| 8,879,257 | B2 | 11/2014 | Campbell et al. |
| 8,899,052 | B2 | 12/2014 | Campbell et al. |
| 8,913,384 | B2 | 12/2014 | David et al. |
| 8,922,998 | B2 | 12/2014 | Campbell et al. |
| 8,925,333 | B2 | 1/2015 | Campbell et al. |
| 8,929,080 | B2 | 1/2015 | Campbell et al. |
| 8,934,250 | B2 | 1/2015 | Campbell et al. |
| 8,941,994 | B2 | 1/2015 | Campbell et al. |
| 8,947,873 | B2 | 2/2015 | Campbell et al. |
| 8,953,317 | B2 | 2/2015 | Campbell et al. |
| 8,955,346 | B2 | 2/2015 | Campbell et al. |
| 8,964,390 | B2 | 2/2015 | Campbell et al. |
| 8,964,391 | B2 | 2/2015 | Campbell et al. |
| 8,966,922 | B2 | 3/2015 | Campbell et al. |
| 8,985,847 | B2 | 3/2015 | Campbell et al. |
| 9,009,968 | B2 | 4/2015 | Campbell et al. |
| 9,009,971 | B2 | 4/2015 | Campbell et al. |
| 9,013,872 | B2 | 4/2015 | Campbell et al. |
| 9,027,360 | B2 | 5/2015 | Chainer et al. |
| 9,038,406 | B2 | 5/2015 | Campbell et al. |
| 9,043,035 | B2 | 5/2015 | Chainer et al. |
| 9,045,995 | B2 | 6/2015 | Graybill et al. |
| 9,052,722 | B2 | 6/2015 | Chainer et al. |
| 9,078,379 | B2 | 7/2015 | Campbell et al. |
| 9,095,889 | B2 | 8/2015 | Campbell et al. |
| 9,095,942 | B2 | 8/2015 | Campbell et al. |
| 9,101,078 | B2 | 8/2015 | Campbell et al. |
| 9,110,476 | B2 | 8/2015 | David et al. |
| 9,148,982 | B2 | 9/2015 | Campbell et al. |
| 9,148,983 | B2 | 9/2015 | Campbell et al. |
| 9,167,721 | B2 | 10/2015 | Campbell et al. |
| 9,173,324 | B2 | 10/2015 | Campbell et al. |
| 9,179,574 | B2 | 11/2015 | Canney et al. |
| 9,185,830 | B2 | 11/2015 | Chainer et al. |
| 9,200,851 | B2 | 12/2015 | Campbell et al. |
| 9,207,002 | B2 | 12/2015 | Campbell et al. |
| 9,210,830 | B2 | 12/2015 | Campbell et al. |
| 9,213,343 | B2 | 12/2015 | Campbell et al. |
| 9,218,008 | B2 | 12/2015 | Campbell et al. |
| 9,250,024 | B2 | 2/2016 | Campbell et al. |
| 9,253,921 | B2 | 2/2016 | Campbell et al. |
| 9,261,308 | B2 | 2/2016 | Campbell et al. |
| 9,282,675 | B2 | 3/2016 | Campbell et al. |
| 9,282,678 | B2 | 3/2016 | Campbell et al. |
| 9,285,050 | B2 | 3/2016 | Campbell et al. |
| 9,288,932 | B2 | 3/2016 | Campbell et al. |
| 9,291,281 | B2 | 3/2016 | Campbell et al. |
| 9,295,181 | B2 | 3/2016 | Campbell et al. |
| 9,301,433 | B2 | 3/2016 | Campbell et al. |
| 9,303,926 | B2 | 4/2016 | Campbell et al. |
| 9,307,674 | B2 | 4/2016 | Chainer et al. |

(56) References Cited

U.S. PATENT DOCUMENTS

| | | | |
|---|---|---|---|
| 9,313,920 B2 | 4/2016 | Campbell et al. |
| 9,332,674 B2 | 5/2016 | Campbell et al. |
| 9,338,924 B2 | 5/2016 | Campbell et al. |
| 9,342,079 B2 | 5/2016 | David et al. |
| 9,351,431 B2 | 5/2016 | Campbell et al. |
| 9,357,674 B2 | 5/2016 | Campbell et al. |
| 9,357,675 B2 | 5/2016 | Campbell et al. |
| 9,357,682 B2 | 5/2016 | Campbell et al. |
| 9,363,924 B2 | 6/2016 | Campbell et al. |
| 9,386,727 B2 | 7/2016 | Barringer et al. |
| 9,410,751 B2 | 8/2016 | David et al. |
| 9,414,519 B2 | 8/2016 | Campbell et al. |
| 9,414,523 B2 | 8/2016 | Chainer et al. |
| 9,414,525 B2 | 8/2016 | Campbell et al. |
| 9,439,325 B2 | 9/2016 | Campbell et al. |
| 9,445,529 B2 | 9/2016 | Chainer et al. |
| 9,460,985 B2 | 10/2016 | Joshi et al. |
| 9,470,439 B2 | 10/2016 | Campbell et al. |
| 9,474,186 B2 | 10/2016 | Campbell et al. |
| 9,518,875 B2 | 12/2016 | Chainer et al. |
| 9,655,282 B2 | 5/2017 | Barringer et al. |
| 9,686,889 B2 | 6/2017 | Campbell et al. |
| 9,719,865 B2 | 8/2017 | Chainer et al. |
| 9,750,159 B2 | 8/2017 | Campbell et al. |
| 9,763,357 B2 | 9/2017 | Campbell et al. |
| 9,831,151 B1 | 11/2017 | Schultz |
| 9,879,926 B2 | 1/2018 | David et al. |
| 2003/0147214 A1 | 8/2003 | Patel et al. |
| 2004/0061218 A1 | 4/2004 | Tilton |
| 2007/0023879 A1 | 2/2007 | Pandey et al. |
| 2007/0121295 A1 | 5/2007 | Campbell et al. |
| 2007/0125523 A1 | 6/2007 | Bhatti et al. |
| 2009/0140417 A1 | 6/2009 | Refai-Ahmed |
| 2009/0218078 A1* | 9/2009 | Brunschwiler | G06F 1/20 165/104.33 |
| 2010/0252234 A1* | 10/2010 | Cambell | H01L 23/473 165/80.2 |
| 2011/0240281 A1 | 10/2011 | Avery |
| 2013/0027878 A1 | 1/2013 | Campbell |
| 2013/0027884 A1 | 1/2013 | Campbell et al. |
| 2014/0015106 A1 | 1/2014 | Hsieh |
| 2014/0085817 A1 | 3/2014 | Campbell et al. |
| 2014/0146467 A1* | 5/2014 | Campbell | H05K 7/20236 361/679.53 |
| 2015/0319883 A1* | 11/2015 | Branton | H05K 7/20754 361/679.53 |
| 2016/0262288 A1 | 9/2016 | Chainer et al. |
| 2016/0338226 A1 | 11/2016 | Sakamoto et al. |
| 2017/0127565 A1* | 5/2017 | Campbell | H05K 7/2039 |
| 2018/0005921 A1 | 1/2018 | Takemura et al. |
| 2018/0090417 A1 | 3/2018 | Gutala |
| 2018/0211900 A1 | 7/2018 | Gutala |
| 2019/0103290 A1 | 4/2019 | Medina |
| 2019/0206764 A1 | 7/2019 | Kulkarni |

OTHER PUBLICATIONS

PCT International Search Report and Written Opinion in International Application No. PCT/US2019/028109, dated Jun. 28, 2019, 16 pages.

PCT International Search Report and Written Opinion in International Application No. PCT/US2019/046794, dated Nov. 15, 2019, 15 pages.

PCT International Search Report and Written Opinion in International Application No. PCT/US2019/027909, dated Aug. 13, 2019, 14 pages.

* cited by examiner

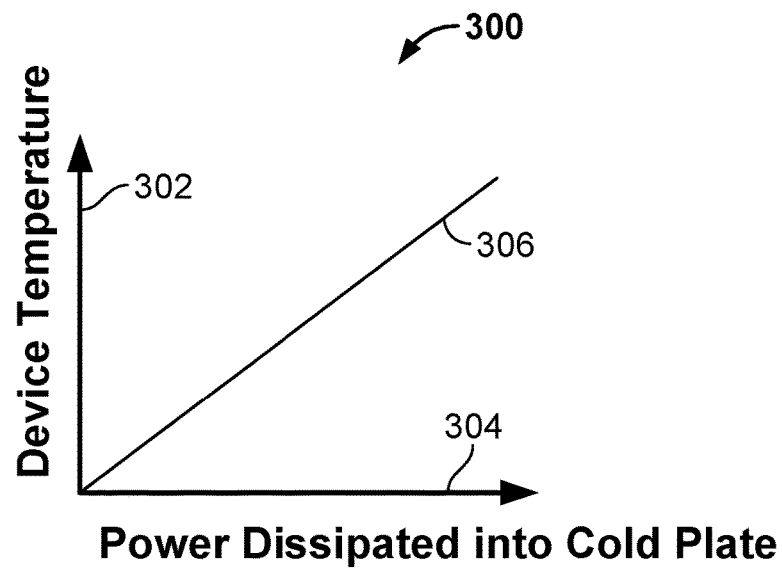
FIG. 3A
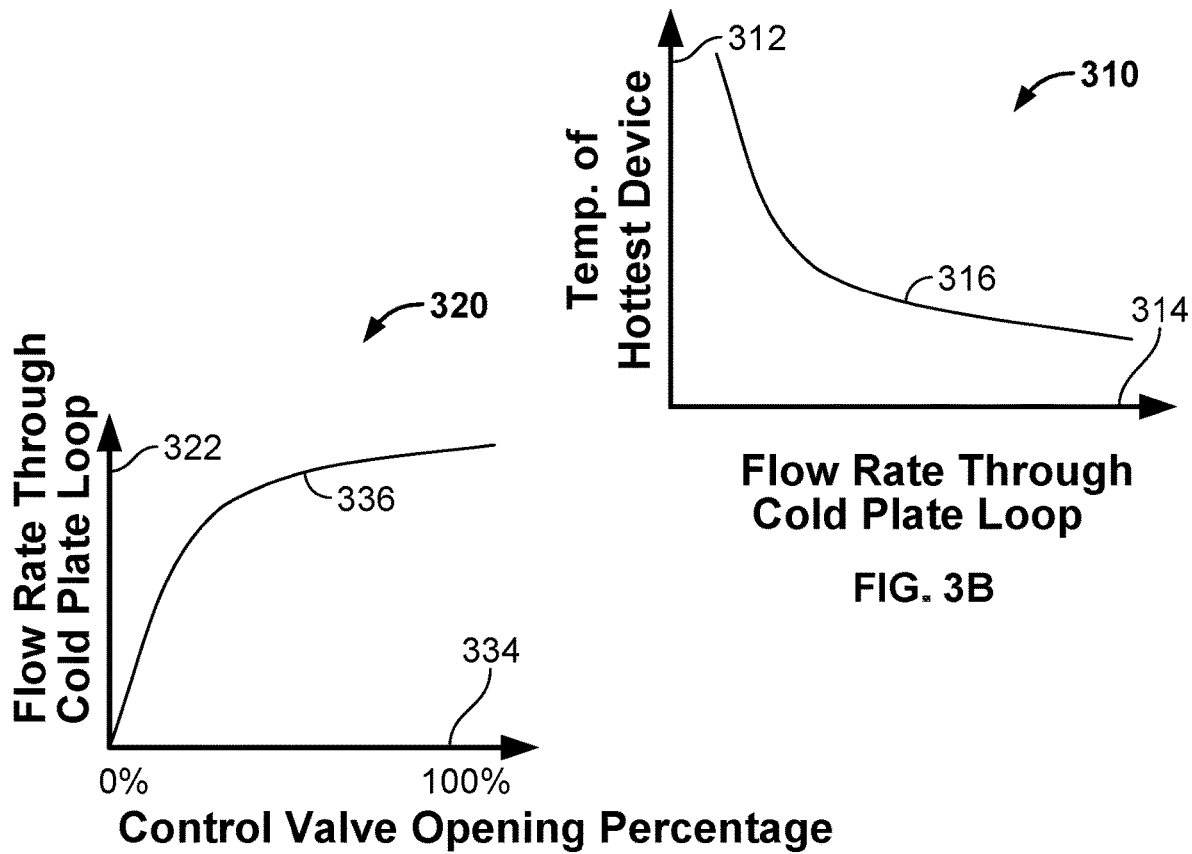
FIG. 3B
FIG. 3C

COOLING ELECTRONIC DEVICES IN A DATA CENTER

TECHNICAL FIELD

This document relates to systems and methods for providing cooling to electronic equipment, such as computer server racks and related equipment in computer data centers, with a cold plate.

BACKGROUND

Computer users often focus on the speed of computer microprocessors (e.g., megahertz and gigahertz). Many forget that this speed often comes with a cost—higher power consumption. This power consumption also generates heat. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. The effects of power consumed by the critical load in the data center are often compounded when one incorporates all of the ancillary equipment required to support the critical load.

Many techniques may be used to cool electronic devices (e.g., processors, memories, networking devices, and other heat generating devices) that are located on a server or network rack tray. For instance, forced convection may be created by providing a cooling airflow over the devices. Fans located near the devices, fans located in computer server rooms, and/or fans located in ductwork in fluid communication with the air surrounding the electronic devices, may force the cooling airflow over the tray containing the devices. In some instances, one or more components or devices on a server tray may be located in a difficult-to-cool area of the tray; for example, an area where forced convection is not particularly effective or not available.

The consequence of inadequate and/or insufficient cooling may be the failure of one or more electronic devices on the tray due to a temperature of the device exceeding a maximum rated temperature. While certain redundancies may be built into a computer data center, a server rack, and even individual trays, the failure of devices due to overheating can come at a great cost in terms of speed, efficiency, and expense.

SUMMARY

This disclosure describes a cooling system, for example, for rack mounted electronic devices (e.g., servers, processors, memory, networking devices or otherwise) in a data center. In various disclosed implementations, the cooling system may be or include a cold plate cooling system according to the present disclosure provides controllable liquid (e.g., water) cooling for server or network heat generating devices, such as processors, memory modules, switches, and other devices. The cold plate cooling system, in some aspects, includes a tray-mounted control valve to meter a cooling liquid flow based on particular tray operating parameters and computer-implemented methods.

In an example implementation, a data center cooling system includes a server rack sub-assembly that includes at least one motherboard mounted on a support member and a plurality of heat generating electronic devices mounted on the at least one motherboard; at least one cold plate positioned in thermal communication with at least a portion of the plurality of heat generating electronic devices, the cold plate configured to receive a flow of a cooling liquid circulated through a supply conduit fluidly coupled to a liquid inlet of the at least one cold plate, through the at least one cold plate, and through a return conduit fluidly coupled to a liquid outlet of the at least one cold plate; and a modulating control valve attached to either of the motherboard or the support member and positioned in either of the supply conduit or the return conduit, the modulating control valve configured to adjust a rate of the flow of the cooling liquid based at least in part on an operating condition of at least one of the plurality of heat generating electronic devices.

In an aspect combinable with the example implementation, the at least one cold plate includes a plurality of cold plates.

In another aspect combinable with any one of the previous aspects, each of the plurality of cold plates is mounted to a respective heat generating electronic device of the plurality of heat generating electronic devices.

In another aspect combinable with any one of the previous aspects, the supply conduit is directly coupled to each liquid inlet of the plurality of cold plates, and the return conduit is directly coupled to each liquid outlet of the plurality of cold plates.

In another aspect combinable with any one of the previous aspects, the supply conduit is directly coupled to a liquid inlet of one of the plurality of cold plates, and the return conduit is directly coupled to a liquid outlet of one of the plurality of cold plates.

In another aspect combinable with any one of the previous aspects, the supply conduit is directly coupled to liquid inlets of a portion of the plurality of cold plates, and the return conduit is directly coupled to liquid outlets of a portion of the plurality of cold plates.

Another aspect combinable with any one of the previous aspects further includes a controller communicably coupled to the modulating control valve.

In another aspect combinable with any one of the previous aspects, the controller is attached to either of the motherboard or the support member.

In another aspect combinable with any one of the previous aspects, the controller is configured to perform operations including determining a value of the operating condition of the at least one heat generating electronic device; and adjusting the modulating control valve to open or close based on the determined value.

In another aspect combinable with any one of the previous aspects, determining the value of the operating condition of the at least one heat generating electronic device includes determining an operating temperature for each of the plurality heat generating electronic devices; determining a maximum operating temperature from the determined operating temperatures; and calculating a thermal margin between the maximum operating temperature and at least one of the operating temperatures.

In another aspect combinable with any one of the previous aspects, adjusting the modulating control valve to open or close based on the determined value includes adjusting the modulating control valve to open based on the calculated thermal margin greater than a threshold thermal margin value.

In another aspect combinable with any one of the previous aspects, determining the value of the operating condition of the at least one heat generating electronic device includes determining a supply cooling liquid temperature; determining a return cooling liquid temperature; and calculating a temperature difference between the supply cooling liquid temperature and the return cooling liquid temperature.

In another aspect combinable with any one of the previous aspects, adjusting the modulating control valve to open or close based on the determined value includes adjusting the modulating control valve to open based on the calculated temperature difference greater than a threshold temperature difference value.

In another aspect combinable with any one of the previous aspects, determining a supply cooling liquid temperature includes receiving a measured temperature value from an inlet temperature sensor in thermal communication with the flow of the cooling liquid through the supply conduit.

In another aspect combinable with any one of the previous aspects, determining a return cooling liquid temperature includes receiving a measured temperature value from an outlet temperature sensor in thermal communication with the flow of the cooling liquid through the return conduit.

In another example implementation, a method for cooling heat generating devices in a data center includes circulating a flow of a cooling liquid to a server rack sub-assembly that includes at least one motherboard mounted on a support member and a plurality of heat generating electronic devices mounted on the at least one motherboard; circulating the flow of the cooling liquid through a supply conduit to a liquid inlet of at least one cold plate positioned in thermal communication with at least a portion of the plurality of heat generating electronic devices; circulating the flow of the cooling liquid through the at least one cold plate to receive heat into the cooling liquid from the portion of the plurality of heat generating electronic devices; circulating the flow of the heated cooling liquid from a liquid outlet of the at least one cold plate through a return conduit; and controlling a modulating control valve attached to either of the motherboard or the support member to adjust a rate of the flow of the cooling liquid based at least in part on an operating condition of at least one of the plurality of heat generating electronic devices.

In an aspect combinable with the example implementation, the at least one cold plate includes a plurality of cold plates, each of the plurality of cold plates mounted to a respective heat generating electronic device of the plurality of heat generating electronic devices.

Another aspect combinable with any one of the previous aspects further includes circulating the flow of cooling liquid directly from the supply conduit to each liquid inlet of the plurality of cold plates; and circulating the flow of the heated cooling liquid directly from each liquid outlet of the plurality of cold plates to the return conduit.

Another aspect combinable with any one of the previous aspects further includes circulating the flow of cooling liquid directly from the supply conduit to a liquid inlet of one of the plurality of cold plates; heating the cooling liquid in the one of the plurality of cold plates; circulating the flow of the heated cooling liquid from a liquid outlet of the one of the plurality of cold plates to a liquid inlet of another of the plurality of cold plates; further heating the heated cooling liquid in the another of the plurality of cold plates; and circulating the flow of the further heated cooling liquid directly from a liquid outlet of the another of the plurality of cold plates to the return conduit.

Another aspect combinable with any one of the previous aspects further includes circulating the flow of cooling liquid directly from the supply conduit to liquid inlets of a first portion of the plurality of cold plates; heating the cooling liquid in the portion of the plurality of cold plates; circulating the flow of the heated cooling liquid from liquid outlets of the first portion of the plurality of cold plates to liquid inlets of a second portion of the plurality of cold plates; further heating the heated cooling liquid in the second portion of the plurality of cold plates; and circulating the flow of the further heated cooling liquid directly from liquid outlets of the second portion of the plurality of cold plates to the return conduit.

Another aspect combinable with any one of the previous aspects further includes determining a value of the operating condition of the at least one heat generating electronic device; and adjusting the modulating control valve to open or close based on the determined value.

In another aspect combinable with any one of the previous aspects, determining the value of the operating condition of the at least one heat generating electronic device includes determining an operating temperature for each of the plurality heat generating electronic devices; determining a maximum operating temperature from the determined operating temperatures; and calculating a thermal margin between the maximum operating temperature and at least one of the operating temperatures.

In another aspect combinable with any one of the previous aspects, adjusting the modulating control valve to open or close based on the determined value includes adjusting the modulating control valve to open based on the calculated thermal margin greater than a threshold thermal margin value.

In another aspect combinable with any one of the previous aspects, determining the value of the operating condition of the at least one heat generating electronic device includes determining a supply cooling liquid temperature; determining a return cooling liquid temperature; and calculating a temperature difference between the supply cooling liquid temperature and the return cooling liquid temperature.

In another aspect combinable with any one of the previous aspects, adjusting the modulating control valve to open or close based on the determined value includes adjusting the modulating control valve to open based on the calculated temperature difference greater than a threshold temperature difference value.

In another aspect combinable with any one of the previous aspects, determining a supply cooling liquid temperature includes receiving a measured temperature value from an inlet temperature sensor in thermal communication with the flow of the cooling liquid through the supply conduit.

In another aspect combinable with any one of the previous aspects, determining a return cooling liquid temperature includes receiving a measured temperature value from an outlet temperature sensor in thermal communication with the flow of the cooling liquid through the return conduit.

Various implementations of a data center cooling system according to the present disclosure may include one, some, or all of the following features. For example, a server rack cold plate cooling system may allow for increased cooling (e.g., through an increase in a cooling fluid flow rate or decrease in cooling fluid temperature) for high power (or high density) servers or other data center electronic devices, while also allowing decreased cooling (e.g., through a decrease in a cooling fluid flow rate or increase in cooling fluid temperature) for low power (or low density) servers or other data center electronic devices. Thus, the server rack cold plate cooling system may provide cooling "on demand" for each specific server tray sub-assembly within a data center (which may be hundreds, thousands, tens of thousands or more). As another example, the server rack cold plate cooling system may provide for lower total time average cooling fluid flow usage and higher efficiency at the data center level. Further, the server rack cold plate cooling system may allow for short periods of time when power can be high by enabling high cooling fluid flow rate usage at such times. For example, peak server performance may be achievable without limiting the demands of the server rack. Thus, a data center may be more easily provisioned on average power load usage rather than peak (or nameplate, or worst case) power load usage.

The details of one or more embodiments are set forth in the accompanying drawings and the description below. Other features, objects, and advantages will be apparent from the description and drawings, and from the claims.

DESCRIPTION OF DRAWINGS

FIGS. 3A-3C are graphs that illustrate relationships between operating variables of the cold plate cooling system of one or more of FIGS. 2A-2C.

DETAILED DESCRIPTION

In some example implementations, a cold plate cooling system according to the present disclosure provides controllable liquid (e.g., water) cooling for server or network heat generating devices, such as processors, memory modules, switches, and other devices. The cold plate cooling system, in some aspects, includes a tray-mounted control valve to meter a cooling liquid flow based on particular tray operating parameters and computer-implemented methods. For example, in some aspects, the control valve is embedded inside a cold plate loop, which is thermally coupled to the heat generating devices of a server tray (or server tray sub-assembly). There may be tens, hundreds, thousands, tens of thousands or more of such trays in a data center.

The cooling liquid (e.g., water) control may allow for scalability and a high level of modularity and allows each tray to function at a different liquid flow rate depending on the potentially unique configuration (or operating condition) of each tray. Thus, cold plate cooling systems of the present disclosure may accommodate variability in tray-to-tray power levels as well as variability of the cooling solution in terms of manufacturing variation and variability of assembly.

In an example operation of the cold plate cooling system, the tray-mounted control valve (or valves) can be adjusted between a minimum to a maximum level. In some aspects, the minimum level is zero percent open, and in some aspects, the maximum level is 100 percent open. A control algorithm executed by a control system may determine or measure particular temperatures associated with the tray for which the cold plate cooling system is providing cooling. If heat generating device power increases, thereby increasing such temperatures, the control valve may be actuated to open more to reduce such temperatures to a target value (or values). In contrast, if heat generating device power decreases, thereby decreasing such temperatures, the control valve may be actuated to close more to allow such temperatures to rise to a target value (or values).

Figure 1A:
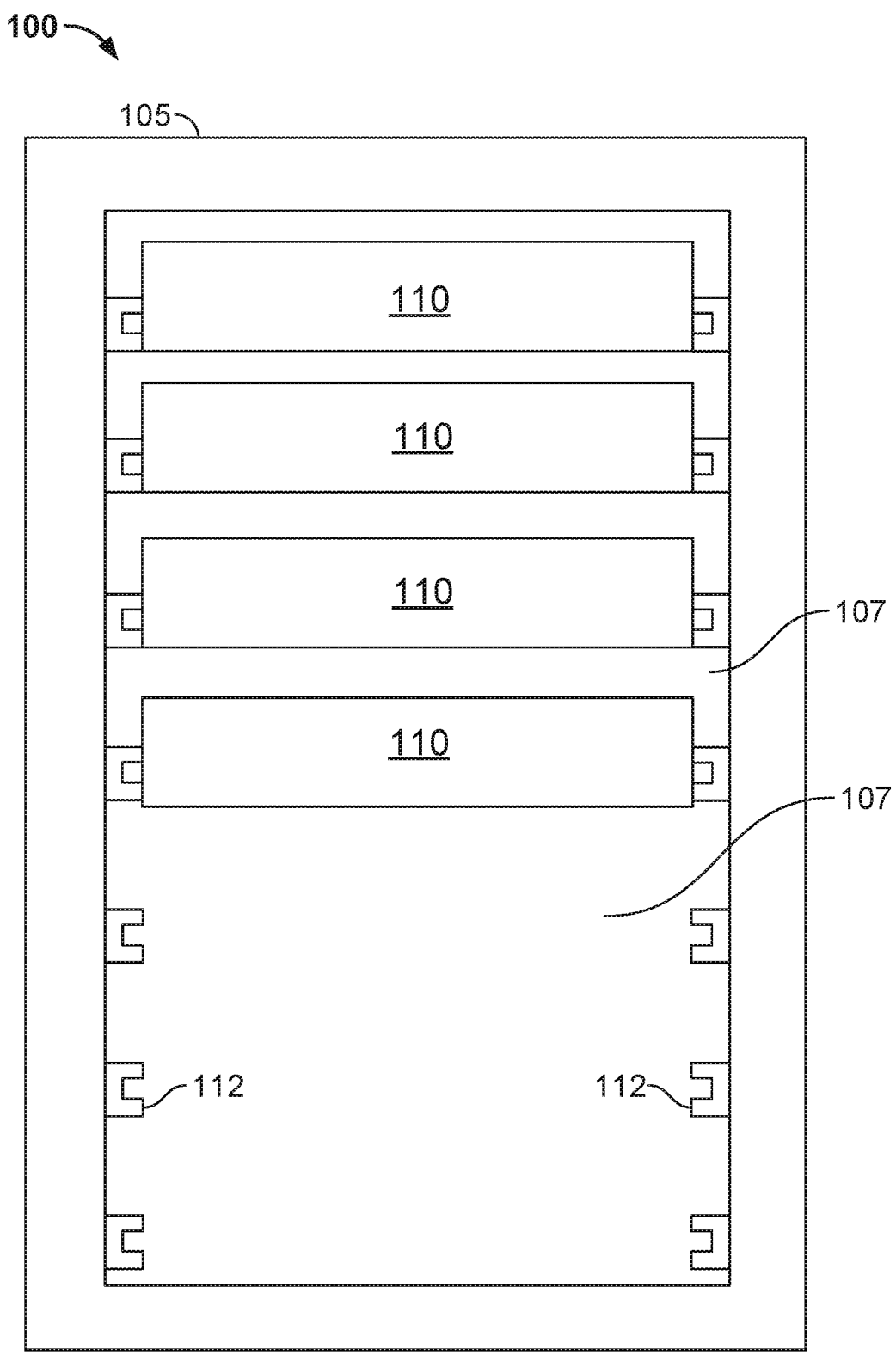
FIG. 1A illustrates a front view of a server rack and a server-rack sub-assemblies configured to mount within a rack used in a data center environment.

FIG. 1 illustrates an example system 100 that includes a server rack 105, e.g., a 13 inch or 19 inch server rack, and multiple server rack sub-assemblies 110 mounted within the rack 105. Although a single server rack 105 is illustrated, server rack 105 may be one of a number of server racks within the system 100, which may include a server farm or a co-location facility that contains various rack mounted computer systems. Also, although multiple server rack sub-assemblies 110 are illustrated as mounted within the rack 105, there might be only a single server rack sub-assembly. Generally, the server rack 105 defines multiple slots 107 that are arranged in an orderly and repeating fashion within the server rack 105, and each slot 107 is a space in the rack into which a corresponding server rack sub-assembly 110 can be placed and removed. For example, the server rack sub-assembly can be supported on rails 112 that project from opposite sides of the rack 105, and which can define the position of the slots 107.

The slots 107, and the server rack sub-assemblies 110, can be oriented with the illustrated horizontal arrangement (with respect to gravity). Alternatively, the slots 107, and the server rack sub-assemblies 110, can be oriented vertically (with respect to gravity), although this would require some reconfiguration of the evaporator and condenser structures described below. Where the slots are oriented horizontally, they may be stacked vertically in the rack 105, and where the slots are oriented vertically, they may be stacked horizontally in the rack 105.

Server rack 105, as part of a larger data center for instance, may provide data processing and storage capacity. In operation, a data center may be connected to a network, and may receive and respond to various requests from the network to retrieve, process, and/or store data. In operation, for example, the server rack 105 typically facilitates the communication of information over a network with user interfaces generated by web browser applications of users who request services provided by applications running on computers in the datacenter. For example, the server rack 105 may provide or help provide a user who is using a web browser to access web sites on the Internet or the World Wide Web.

The server rack sub-assembly 110 may be one of a variety of structures that can be mounted in a server rack. For example, in some implementations, the server rack sub-assembly 110 may be a "tray" or tray assembly that can be slidably inserted into the server rack 105. The term "tray" is not limited to any particular arrangement, but instead applies to motherboard or other relatively flat structures appurtenant to a motherboard for supporting the motherboard in position in a rack structure. In some implementations, the server rack sub-assembly 110 may be a server chassis, or server container (e.g., server box). In some implementations, the server rack sub-assembly 110 may be a hard drive cage.

Figure 1B:
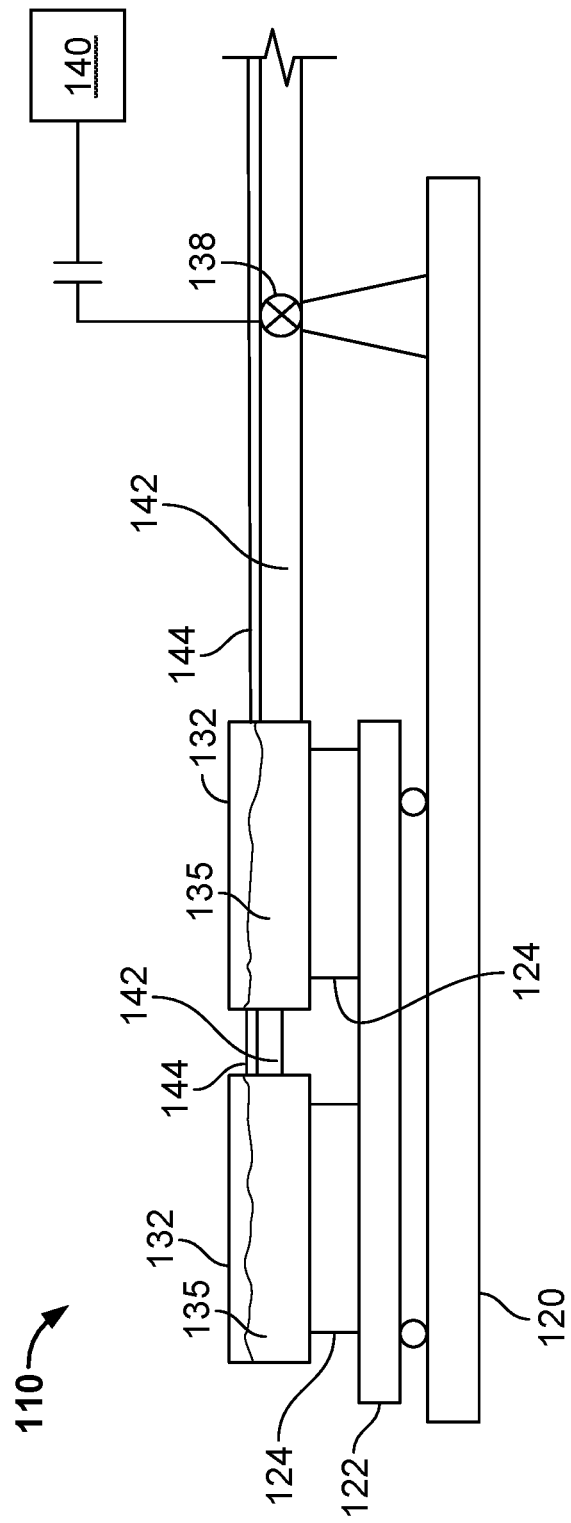
FIG. 1B illustrates a side view of at least a portion of a server-rack sub-assembly configured to mount within a rack used in a data center environment.

Referring to FIG. 1B, the server rack sub-assembly 110 includes a frame or cage 120, a printed circuit board 122, e.g., motherboard, supported on the frame 120, one or more heat-generating electronic devices 124, e.g., a processor or memory, mounted on the printed circuit board 122, and one or more cold plates 132. One or more fans (not shown) can also be mounted on the frame 120.

The frame 120 can include or simply be a flat structure onto which the motherboard 122 can be placed and mounted, so that the frame 120 can be grasped by technicians for moving the motherboard into place and holding it in position within the rack 105. For example, the server rack sub-assembly 110 may be mounted horizontally in the server rack 105 such as by sliding the frame 120 into the slot 107 and over a pair of rails in the rack 105 on opposed sides of the server rack sub-assembly 110—much like sliding a lunch tray into a cafeteria rack. Although FIG. 1B illustrates the frame 120 extending below the motherboard 122, the frame can have other forms (e.g., by implementing it as a peripheral frame around the motherboard) or may be eliminated so that the motherboard itself is located in, e.g., slidably engages, the rack 105. In addition, although FIG. 1B illustrates the frame 120 as a flat plate, the frame 120 can include one or more side walls that project upwardly from the edges of the flat plate, and the flat plate could be the floor of a closed-top or open-top box or cage.

The illustrated server rack sub-assembly 110 includes a printed circuit board 122, e.g., a motherboard, on which a variety of components are mounted, including heat-generating electronic devices 124. Although one motherboard 122 is illustrated as mounted on the frame 120, multiple motherboards may be mounted on the frame 120, depending on the needs of the particular application. In some implementations, the one or more fans (not shown) can be placed on the frame 120 so that air enters at the front edge (at the left hand side in FIG. 1B) of the server rack sub-assembly 110, closer to the front of the rack 105 when the sub-assembly 110 is installed in the rack 105, flows (as illustrated) over the motherboard 122, over some of the heat generating components on the motherboard 122, and is exhausted from the server rack assembly 110 at the back edge (at the right hand side), closer to the back of the rack 105 when the sub-assembly 110 is installed in the rack 105. The one or more fans can be secured to the frame 120 by brackets. Thus, the fans can pull air from within the frame 120 area and push the air after it has been warmed out the rack 105. An underside of the motherboard 122 can be separated from the frame 120 by a gap.

As shown, each cold plate heat exchanger (or "cold plate") 132 contacts the electronic device 124 so that heat is drawn by conductive heat transfer from the electronic device 124 to the cold plate 132. For example, the cold plate 132 is in conductive thermal contact with the electronic device 124. In particular, the bottom of the cold plate 132 contacts the top of the electronic device 124. In operation, a working liquid 135, such as water, glycol, or another cooling liquid, is circulated (e.g., pumped) from a cooling liquid source (not shown) through a supply conduit 144 to each cold plate 132. Heat from the electronic device 124 causes the working liquid 135 in the cold plate 132 to rise in temperature. The heated liquid 135 then passes through return conduit 142, through control valve 138 to the cooling liquid source. The cooling liquid source may be a mechanical refrigeration cooling source or an evaporative cooling source, for example. Thus, the cooling liquid 135 may remove heat from the electronic device 124.

As shown, the control valve 138 (positioned in the return conduit 142 in this example) is mounted on the server tray sub-assembly 110, and in this example, on the frame 120. In alternative examples, the control valve 138, which may be a plug or ball valve as examples, may be mounted on another component of the server tray sub-assembly 110, such as the mother board 122.

As further shown in this example, the control valve 138 is communicably coupled (e.g., through a wired or wireless connection) to a controller 140. More specifically, a valve actuator (not shown) that is part of or attached to the control valve 138 may be communicably coupled to the control 140 to receive commands (e.g., to open or close) from the controller 140. In example implementations, the controller 140 is a proportional integral derivative (PID) controller. But in alternative implementations, the controller 140 may be another form of a microprocessor-based controller or even a mechanical, electro-mechanical, pneumatic, or hydraulic controller.

In some aspects, the controller 140 may also be communicably coupled to other components on the server rack sub-assembly 110 that are not shown, such as for example, temperature sensors, pressure sensors, or the electronic devices 124 themselves. For example, the controller 140 may be communicably coupled to temperature sensors in thermal communication with the electronic devices 124 so as to measure or determine an operating temperature of the respective electronic devices 124. In some aspects, such temperature sensors may be mounted on the presumed hottest portion of the respective electronic devices 124. In addition or alternatively, the controller 140 may be communicably coupled to temperature sensors positioned on the sub-assembly 110 to measure operating temperature of the sub-assembly 110, generally.

In some aspects, the controller 140 may be in communication with the electronic devices 124 to determine or measure, for example, operating power, operating utilization, or both. For example, in some aspects, heat generated by the electronic devices 124 may be related (directly or otherwise) to an amount of electric power consumed by the devices 124. Further, heat generated by the electronic devices 124 may be related (directly or otherwise) to a utilization percentage of the devices 124. Thus, by determining or measuring consumed electrical power or utilization of the electronic devices 124, an amount of heat (and thus temperature) may be at least indirectly determined by the controller 140.

Figure 2A:
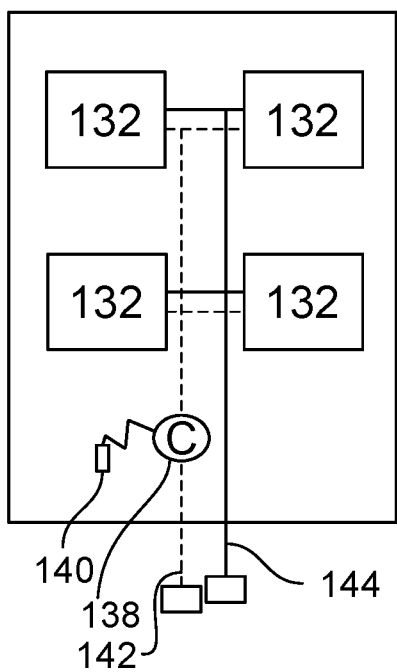
FIGS. 2A-2C illustrate schematic top views of example implementations of a server rack sub-assembly that includes example implementations of a cold plate cooling system.
Figure 2B:
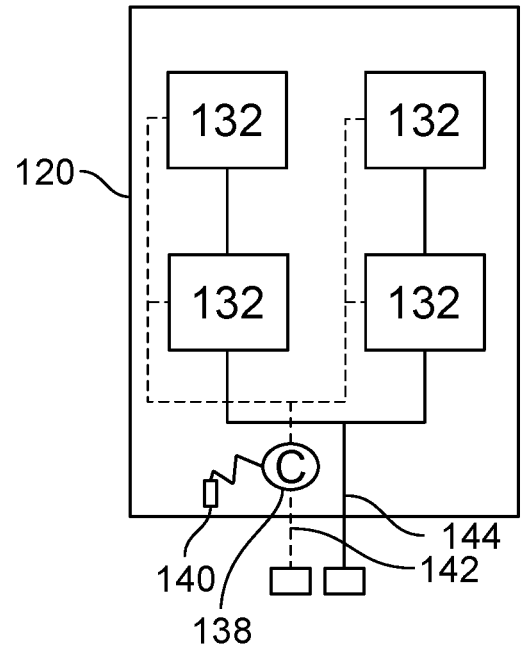
Figure 2C:
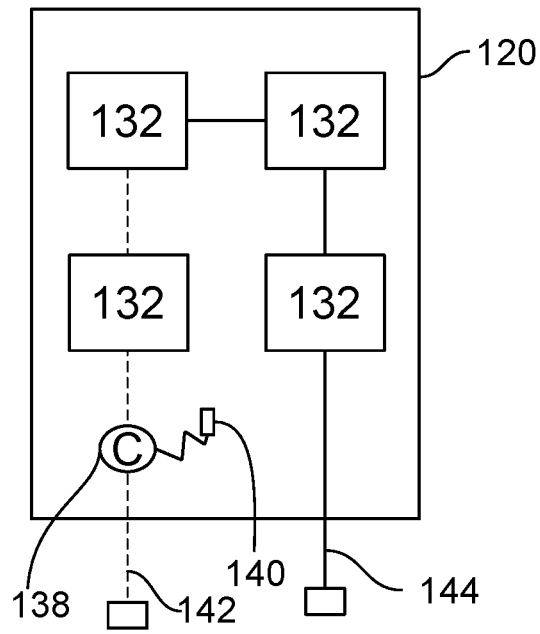

FIGS. 2A-2C illustrate schematic top views of example implementations of a server rack sub-assembly 110 that includes example implementations of a cold plate cooling system. In the example implementations of FIGS. 2A-2C, the cold plate cooling system includes, for instance, one or more cold plate heat exchangers, or cold plates, 132 that are fluidly coupled to the control valve 138 that is communicably coupled to the controller 140. In these examples, the control valve 138 is mounted to the server tray sub-assembly 110 and, more specifically, the frame 120. While four cold plates 132 are shown in these examples, there may be more or fewer as may be dictated, for instance, by a number of processors (e.g., electronic devices 124) mounted on the server tray sub-assembly 110. Thus, in some aspects, there may be a one-to-one ratio of processors (e.g., electronic devices 124) to cold plates 132. In alternative examples, there may be a different ratio of processors (e.g., electronic devices 124) to cold plates 132. Further, in this example, there is a single control valve 138 for the multiple cold plates 132 (e.g., a 1:4 ratio); alternatively, there may be other arrangements in which there may be a 1:2 ratio, 1:1 ratio, or other ratio of control valves 138 to cold plates 132.

As shown in these example, a supply conduit 144 is fluidly coupled to inlets of the cold plates 132 while a return conduit 142 is fluidly coupled to outlets of the cold plates 132. Generally, the supply conduit 144 is fluidly coupled to a supply side of a cooling liquid source (not shown), such as, for example, a chiller, evaporative cooling source, or otherwise, while the return conduit 142 is fluidly coupled to a return side of the cooling liquid source. In this example, the control valve 138 is fluidly coupled within the return conduit 142; alternatively, the control valve 138 is fluidly coupled within the supply conduit 144.

In some aspects, the controller 140 may be communicably coupled to temperature sensors (not shown) that are on or in thermal contact with the electronic devices 124 on which the cold plates 132 are mounted. Such temperature sensors may measure operating temperature values of each of the electronic devices 124.

Each of FIGS. 2A-2C show an example arrangement of the cold plates 132 with respect to how they are fluidly coupled within the cold plate cooling system. For example, turning to FIG. 2A specifically, this figure shows an example implementation of the cold plate cooling system in which the cold plates 132 are fluidly connected in parallel. Thus, as shown, each of the cold plates 132 is directly coupled to the supply conduit 144 (at inlets of the respective cold plates 132). Further, each of the cold plates 132 is directly coupled to the return conduit 142 (at outlets of the respective cold plates 132). In this example, since each cold plate 132 is directly coupled to the supply conduit 144 (e.g., there is not another cold plate 132 fluidly connected between the supply conduit 144 and each other cold plate 132), a temperature of a cooling liquid supply at inlets of each cold plate 132 is identical or substantially the same (e.g., accounting for potential temperature differences at inlets caused by heat gain in the supply conduit 144). While each cold plate 132 may, therefore, receive the cooling liquid at an identical or similar temperature, a temperature of the cooling liquid at outlets of the cold plates 132 may vary, e.g., due to different heat loads (e.g., caused by different power usages) of each of the electronic devices 124 thermally coupled to the respective cold plates 132.

Turning to FIG. 2B, this figure shows an example implementation of the cold plate cooling system in which a pair of cold plates 132 are fluidly connected in series, and each pair (two shown) is fluidly connected in parallel with another pair. Thus, as shown, two of the four cold plates 132 (labeled cold plates 132a) are directly coupled to the supply conduit 144 (at inlets of the respective cold plates 132a). An inlet of each of the other two cold plates 132 (labeled cold plates 132b) is fluidly coupled to an outlet of one of the two directly coupled cold plates 132a; thus, each of the other two cold plates 132b are indirectly coupled to the supply conduit 144 through the cold plates 132a. Each of the cold plates 132b is directly coupled to the return conduit 142 (at outlets of the respective cold plates 132b). In this example, since each cold plate 132a is directly coupled to the supply conduit 144 (e.g., there is not another cold plate 132 fluidly connected between the supply conduit 144 and each cold plate 132a), a temperature of a cooling liquid supply at inlets of each cold plate 132a is identical or substantially the same (e.g., accounting for potential temperature differences at inlets caused by heat gain in the supply conduit 144). However, a temperature of the cooling liquid supply at inlets of each cold plate 132b may be higher than the temperature of the cooling liquid supply at inlets of the cold plates 132a due to heat transferred in the cold plates 132a to the cooling liquid. Further, in some aspects, a temperature of the cooling liquid supply at inlets of the respective cold plates 132b may be different due to differences in amount of heat transferred in the cold plates 132a to the cooling liquid. Thus, temperature of the cooling liquid at outlets of the cold plates 132a and 132b may vary, e.g., due to different heat loads (e.g., caused by different power usages) of each of the electronic devices 124 thermally coupled to the respective cold plates 132 (cold plates 132a and 132b).

Turning to FIG. 2C, this figure shows an example implementation of the cold plate cooling system in which the cold plates 132 are fluidly connected in series. Thus, as shown, one of the four cold plates 132 (labeled cold plate 132a) is directly coupled to the supply conduit 144 (at an inlet of the cold plate 132a). The outlet of cold plate 132a is directly coupled to the inlet of the cold plate 132b; the outlet of cold plate 132b is directly coupled to the inlet of the cold plate 132c; and the outlet of cold plate 132c is directly coupled to the inlet of the cold plate 132d. In this example, since only cold plate 132a is directly coupled to the supply conduit 144 (e.g., there is not another cold plate 132 fluidly connected between the supply conduit 144 and the cold plate 132a), a temperature of a cooling liquid supply at the inlet of the cold plate 132a is likely to be less than a temperature of the cooling liquid supply at the inlet of cold plate 132b. Likewise, a temperature of the cooling liquid supply at the inlet of the cold plate 132b is likely to be less than a temperature of the cooling liquid supply at the inlet of cold plate 132c, and a temperature of the cooling liquid supply at the inlet of the cold plate 132c is likely to be less than a temperature of the cooling liquid supply at the inlet of cold plate 132d (e.g., due to heat gained into the cooling liquid at each of the respective cold plates 132a, 132b, and 132c).

FIGS. 3A-3C are graphs that illustrate relationships between operating variables of the cold plate cooling system of one or more of FIGS. 2A-2C. For example, graph 300 shown in FIG. 3A shows a relationship between device temperature on a y-axis 302 and power dissipated into a cold plate on x-axis 304. Thus, as shown, curve 306 shows the relationship between how hot an electronic device 124 is relative to the heat power from the electronic device 124 dissipated into the cold plate 132 that is mounted to the device 124. As shown in graph 300, there is a linear relationship (e.g., for constant cooling flow rate through the cold plate 132) between device temperature and heat dissipated into the cold plate 132.

Turning to FIG. 3B, this figure includes graph 310, which shows a relationship between a hottest device temperature (e.g., the hottest electronic device 124 on the server tray sub-assembly 110) on a y-axis 312 and cooling liquid flow rate through a cold plate on x-axis 314. Thus, as shown, curve 316 shows the relationship between the temperature of the hottest electronic device 124 on the sub-assembly 110 relative to how much (e.g., volumetric flow per unit time) cooling liquid flows through the cold plate 132 that is mounted to the hottest device 124. As shown in graph 310, there is a non-linear relationship between hottest device temperature and cooling liquid flow rate through the cold plate 132. In some aspects, graph 310 illustrates how a known relationship of temperature (e.g., of the hottest electronic device 124) and flow rate (e.g., of the cooling liquid flow rate) may be characterized and functionally described (e.g., temperature depends on flow rate and a change of flow rate with the valve 138 changes temperature).

Turning to FIG. 3C, this figure includes graph 320, which shows a relationship between cooling liquid flow rate through the cold plate cooling system on a y-axis 322 and control valve open percentage on x-axis 324. Thus, as shown, curve 326 shows the relationship between the liquid flow rate relative to the open state (e.g., percentage) of the control valve 138. As shown in graph 320, there is a non-linear relationship between flow rate and control valve open percentage. In some aspects, graph 320 illustrates the direct relationship between valve opening percentage and flow rate through the valve, such that, e.g., if the valve maintains a minimum open percentage, then transient heat increases may be handled with little change in the opening percentage above the minimum.

Figure 4:
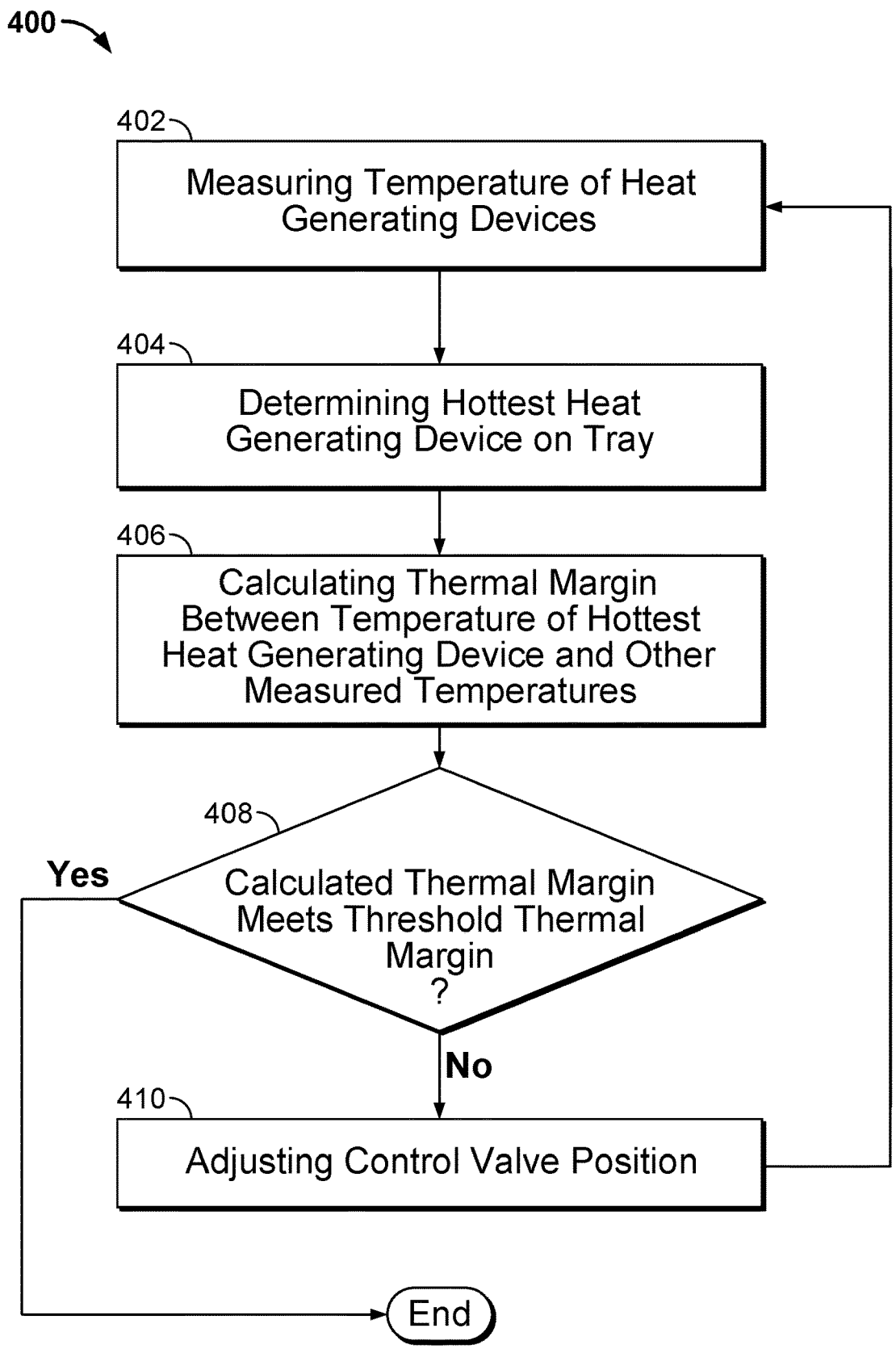
FIG. 4 is a flowchart that illustrates an example method of operating a cold plate cooling system of one or more of FIGS. 2A-2C.

FIG. 4 is a flowchart that illustrates an example method 400 of operating a cold plate cooling system of one or more of FIGS. 2A-2C. For example, in some aspects, method 400 may illustrate an example method for operating one or more of the cold plate cooling systems of FIGS. 2A-2C according to, for instance, one or more measured temperature values of one or more of the electronic devices 124 of the server tray sub-assembly 110. In some aspects, method 400 may be performed by or with the controller 140. Method 400 may begin at step 402, which includes measuring one or more temperatures of heat generating devices, such as the electronic devices 124. For example, in some aspects, the controller 140 is communicably coupled to the electronic devices 124 to receive temperature values, or to temperature sensors in thermal communication with the electronic devices 124.

Method 400 may continue at step 404, which includes determining a hottest heat generating device on a server tray, such as the server rack sub-assembly 110. For example, upon polling each of the electronic devices 124 for operational temperature values (or temperature sensors thermally coupled to the electronic devices 124), the controller 140 may determine the highest operating temperature, e.g., the hottest electronic device 124.

Method 400 may continue at step 406, which includes calculating a thermal margin between a temperature of the hottest heat generating device and at least one of the other measured temperatures (e.g., in step 402). For example, the controller 140 may calculate the thermal margin by calculating the difference between the temperature of the hottest electronic device 124 and, for example, the temperature of the coldest electronic device 124 on the server tray sub-assembly 110. Alternatively, the controller 140 may calculate the thermal margin by calculating the difference between the temperature of the hottest electronic device 124 and, for example, an average temperature of all of the electronic devices 124 on the server tray sub-assembly 110. In some aspects, there is an actual thermal margin (ATM) (e.g., based on actual temperatures being measured) and a target or threshold thermal margin (TTM) (e.g., which is a setpoint or specified value).

Method 400 may continue at step 408, which includes a determination of whether the calculated thermal margin meets a threshold thermal margin value. For example, after the thermal margin is calculated by the controller 140, the controller 140 may compare the calculated thermal margin to a pre-determined or otherwise programmed thermal margin setpoint (or threshold). For example, an example thermal margin setpoint may be 10° C. If the calculated thermal margin is less than the setpoint (e.g., the electronic devices 124 are being adequately cooled), the controller 140 determines that the decision in step 408 is "yes" and method 400 may end or repeat at step 402.

If the calculated thermal margin is greater than the setpoint (e.g., the electronic devices 124 are not being adequately cooled), the controller 140 determines that the decision in step 408 is "no" and method 400 may continue at step 410, which includes adjusting a position (e.g., a percentage open) of a control valve. For example, the controller 140 may actuate the control valve 138 to open more than a current position of the valve 138 to, e.g., allow a greater flow rate of the cooling liquid to flow through the cold plate cooling system to increase a heat dissipation rate of the electronic devices 124 into the cold plates 132. Step 410 may continue, for example, back to step 402 after the control valve 138 is adjusted.

Figure 5:
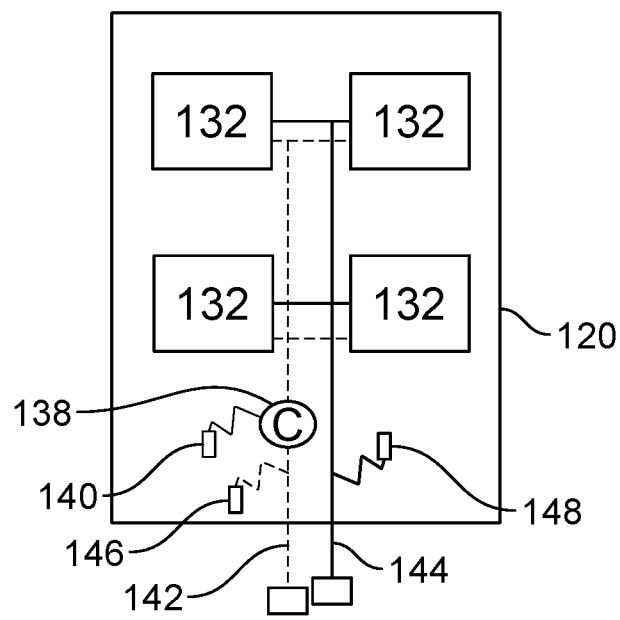
FIG. 5 illustrates a schematic top view of another example implementation of a server rack sub-assembly that includes an example implementation of a cold plate cooling system.

FIG. 5 illustrates a schematic top view of another example implementation of a server rack sub-assembly that includes an example implementation of a cold plate cooling system. This figure shows an example implementation of the cold plate cooling system in which the cold plates 132 are fluidly connected in parallel (similar to FIG. 2A). Thus, as shown, each of the cold plates 132 is directly coupled to the supply conduit 144 (at inlets of the respective cold plates 132). Further, each of the cold plates 132 is directly coupled to the return conduit 142 (at outlets of the respective cold plates 132). In this example, since each cold plate 132 is directly coupled to the supply conduit 144 (e.g., there is not another cold plate 132 fluidly connected between the supply conduit 144 and each other cold plate 132), a temperature of a cooling liquid supply at inlets of each cold plate 132 is identical or substantially the same (e.g., accounting for potential temperature differences at inlets caused by heat gain in the supply conduit 144). While each cold plate 132 may, therefore, receive the cooling liquid at an identical or similar temperature, a temperature of the cooling liquid at outlets of the cold plates 132 may vary, e.g., due to different heat loads (e.g., caused by different power usages) of each of the electronic devices 124 thermally coupled to the respective cold plates 132.

In this example, a temperature sensor 148 is mounted in or to the supply conduit 144 (or in thermal communication with the supply conduit 144). Also, as shown, a temperature sensor 146 is mounted in or to the return conduit 142 (or in thermal communication with the return conduit 142). Thus, temperature sensor 148 can measure a temperature of the cooling liquid in the supply conduit 144, while the temperature sensor 146 can measure a temperature of the cooling liquid in the return conduit 142.

Figure 7:
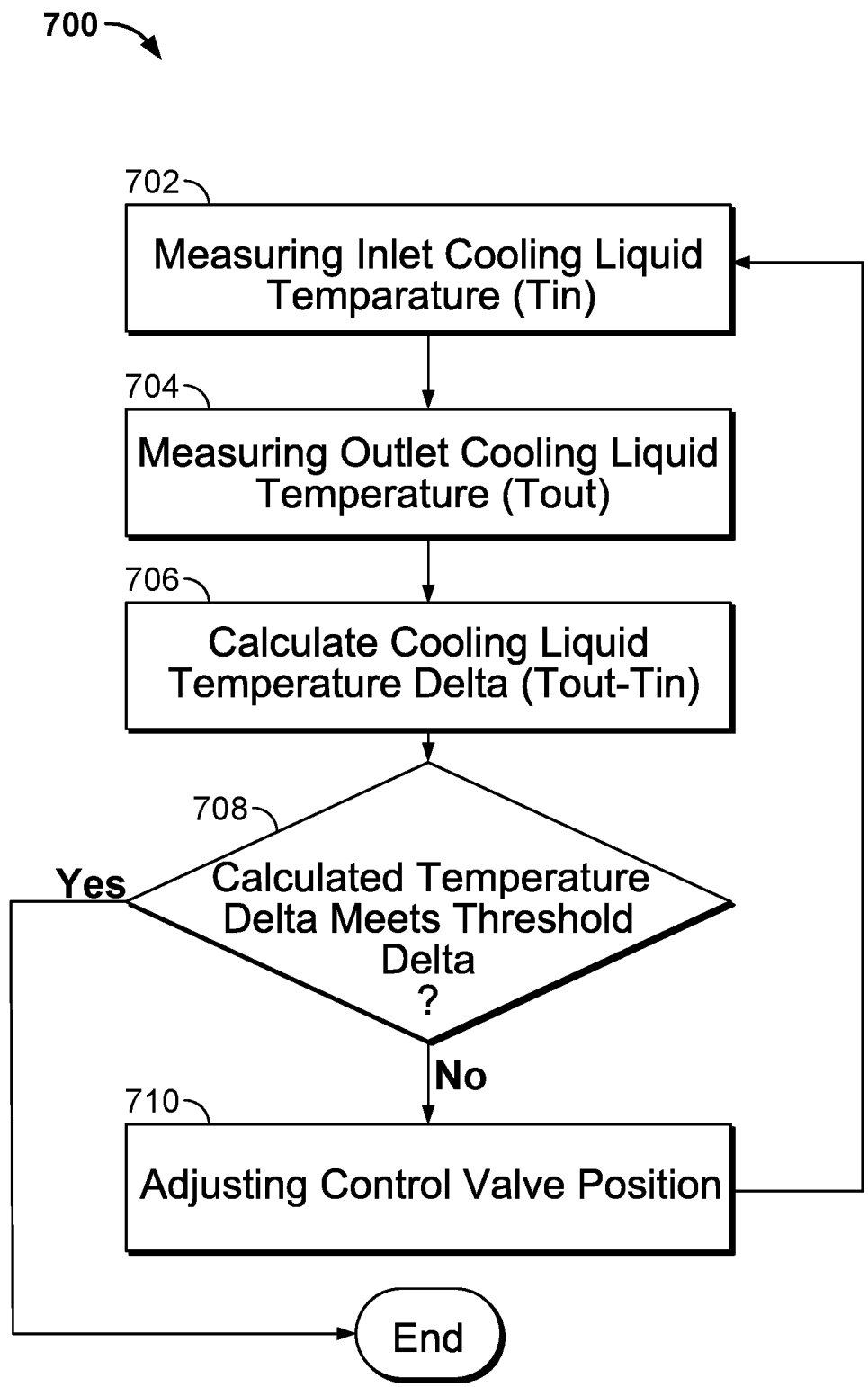
FIG. 7 is a flowchart that illustrates an example method of operating a cold plate cooling system of FIG. 5.

These temperature sensors 146 and 148 may be communicably coupled to the controller 140. Thus, the cold plate cooling system shown in this example of FIG. 5 may be controlled based at least partly on one or both of the temperature values of the cooling liquid provided to the controller by temperature sensors 146 and 148 (e.g., cooling liquid temperature control). Turning to FIG. 7, this figure shows a flowchart that illustrates an example method 700 of operating the cold plate cooling system of FIG. 5. For example, in some aspects, method 700 may illustrate an example method for operating the cold plate cooling system of FIG. 5 according to, for instance, the one or more measured temperature values of the cooling liquid used to cool the electronic devices 124. In some aspects, method 700 may be performed by or with the controller 140. Method 700 may also be used (along with temperature sensors 146 and 148) to operate the example cold plate cooling systems of FIGS. 2B and 2C as well. Method 700 may begin at step 702, which includes measuring an inlet cooling liquid temperature ($T_{in}$). For example, the controller 140 may poll (or receive from) the temperature sensor 148 a temperature of the cooling liquid that is flowing through the supply conduit 144.

Method 700 may continue at step 704, which includes measuring an outlet cooling liquid temperature ($T_{out}$). For example, the controller 140 may poll (or receive from) the temperature sensor 146 a temperature of the cooling liquid that is flowing through the return conduit 142. Steps 702 and 704 may be performed in an alternative order, or may be performed simultaneously as well.

Method 700 may continue at step 706, which includes calculating a temperature delta between $T_{in}$ and $T_{out}$ ($T_{delta}=T_{out}-T_{in}$). For example, the controller 140 may calculate $T_{delta}$ at a particular time of operation of the cold plate cooling system.

Method 700 may continue at step 708, which includes a determination of whether the calculated temperature delta meets a threshold temperature delta value. For example, after the $T_{delta}$ is calculated by the controller 140, the controller 140 may compare the calculated $T_{delta}$ to a pre-determined or otherwise programmed $T_{delta}$ setpoint (or threshold). For example, an example $T_{delta}$ setpoint may be 10° C. If the calculated $T_{delta}$ is less than the setpoint (e.g., the electronic devices 124 are being adequately cooled), the controller 140 determines that the decision in step 708 is "yes" and method 700 may end or repeat at step 702.

If the calculated $T_{delta}$ is greater than the setpoint (e.g., the electronic devices 124 are not being adequately cooled), the controller 140 determines that the decision in step 708 is "no" and method 700 may continue at step 710, which includes adjusting a position (e.g., a percentage open) of a control valve. For example, the controller 140 may actuate the control valve 138 to open more than a current position of the valve 138 to, e.g., allow a greater flow rate of the cooling liquid to flow through the cold plate cooling system to increase a heat dissipation rate of the electronic devices 124 into the cold plates 132. Step 710 may continue, for example, back to step 702 after the control valve 138 is adjusted.

Figure 6:
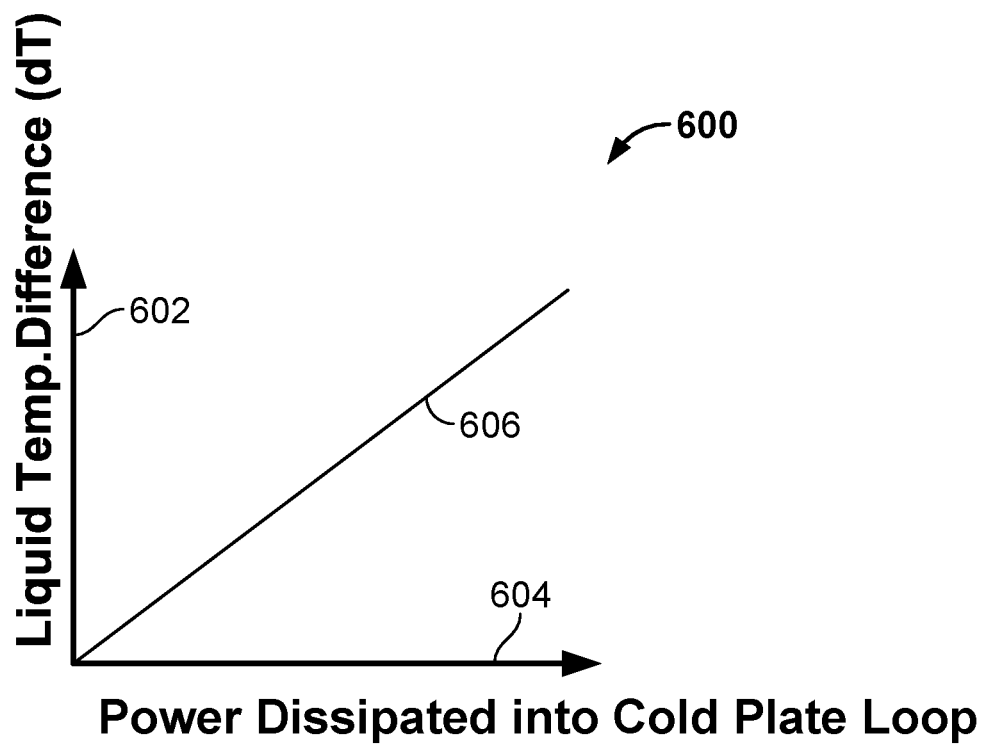
FIG. 6 is a graph that illustrates a relationship between operating variables of the cold plate cooling system of FIG. 5.

FIG. 6 is a graph that illustrates a relationship between operating variables of the cold plate cooling system of FIG. 5. This figure includes graph 600, which shows a relationship between $T_{delta}$ on a y-axis 602 and heat power dissipated on the server tray sub-assembly 110 on x-axis 604. Thus, as shown, curve 606 shows the relationship between the $T_{delta}$ relative to how much heat is removed from the electronic devices 124 on the sub-assembly 110 (e.g., with the cold plate cooling system of FIG. 5). As shown in graph 600, there is a linear relationship between $T_{delta}$ and heat dissipation from the electronic devices 124 such that the greater the $T_{delta}$ (e.g., greater the actual thermal margin), the more power is dissipated in the electronic device 124.

Figure 8:
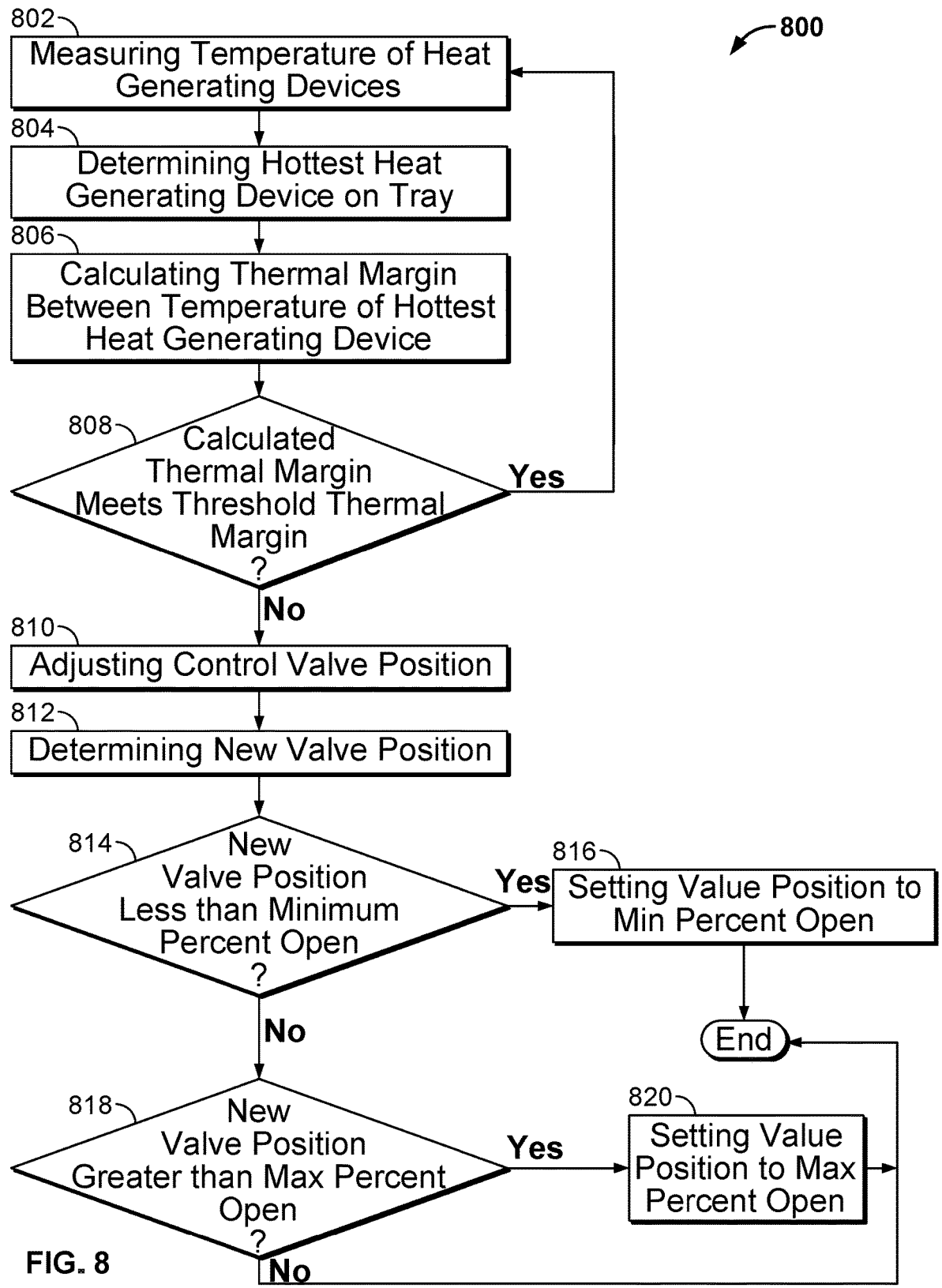
FIG. 8 is a flowchart that illustrates another example method of operating a cold plate cooling system of the present disclosure.

FIG. 8 is a flowchart that illustrates another example method 800 of operating a cold plate cooling system of the present disclosure. For example, in some aspects, method 800 may illustrate an example method for operating the cold plate cooling system of any one of FIGS. 2A-2C (or FIG. 5) according to, for instance, the one or more measured temperature values of the cooling liquid used to cool the electronic devices 124 as well as percent open constraints on the control valve 138. In some aspects, method 800 may be performed by or with the controller 140. Method 800 may begin at step 802, which includes measuring one or more temperatures of heat generating devices, such as the electronic devices 124. For example, in some aspects, the controller 140 is communicably coupled to the electronic devices 124 to receive temperature values, or to temperature sensors in thermal communication with the electronic devices 124.

Method 800 may continue at step 804, which includes determining a hottest heat generating device on a server tray, such as the server rack sub-assembly 110. For example, upon polling each of the electronic devices 124 for operational temperature values (or temperature sensors thermally coupled to the electronic devices 124), the controller 140 may determine the highest operating temperature, e.g., the hottest electronic device 124.

Method 800 may continue at step 806, which includes calculating a thermal margin between a temperature of the hottest heat generating device and at least one of the other measured temperatures (e.g., in step 402). For example, the controller 140 may calculate the thermal margin by calculating the difference between the temperature of the hottest electronic device 124 and, for example, the temperature of the coldest electronic device 124 on the server tray sub-assembly 110. Alternatively, the controller 140 may calculate the thermal margin by calculating the difference between the temperature of the hottest electronic device 124 and, for example, an average temperature of all of the electronic devices 124 on the server tray sub-assembly 110.

Method 800 may continue at step 808, which includes a determination of whether the calculated thermal margin meets a threshold thermal margin value. For example, after the thermal margin is calculated by the controller 140, the controller 140 may compare the calculated thermal margin to a pre-determined or otherwise programmed thermal margin setpoint (or threshold). For example, an example thermal margin setpoint may be 10° C. If the calculated thermal margin is less than the setpoint (e.g., the electronic devices 124 are being adequately cooled), the controller 140 determines that the decision in step 808 is "yes" and method 800 may repeat at step 802.

If the calculated thermal margin is greater than the setpoint (e.g., the electronic devices 124 are not being adequately cooled), the controller 140 determines that the decision in step 808 is "no" and method 800 may continue at step 810, which includes adjusting a position (e.g., a percentage open) of a control valve. For example, the controller 140 may actuate the control valve 138 to open more than a current position of the valve 138 to, e.g., allow a greater flow rate of the cooling liquid to flow through the cold plate cooling system to increase a heat dissipation rate of the electronic devices 124 into the cold plates 132.

Method 800 may continue at step 812, which includes determining the new valve position to which the control valve 138 was adjusted in step 810. Steps 810 and 812 may, in some aspects, be performed by the controller 140 simultaneously.

Method 800 may continue at step 814, which includes a determination of whether the new valve position (determined in step 812) is less than a minimum open percentage. If the controller 140 determines that the determined valve percent open position is less than the minimum open percentage, then method 800 continues to step 816, which includes setting (e.g., actuating) the control valve 138 to the minimum percent open position (which may be predetermined or otherwise programmed in the controller 140).

If the controller 140 determines that the determined valve percent open position is greater than the minimum open percentage, then method 800 continues to step 818, which includes a determination of whether the new valve position (determined in step 812) is greater than a maximum open percentage. If the controller 140 determines that the determined valve percent open position is greater than the maximum open percentage, then method 800 continues to step 820, which includes setting (e.g., actuating) the control valve 138 to the maximum percent open position (which may be predetermined or otherwise programmed in the controller 140). If the controller 140 determines, based on steps 814 and 818, that the control valve open percentage is between the minimum and maximum set positions, then method 800 may end or continue back to step 802.

Figure 9:
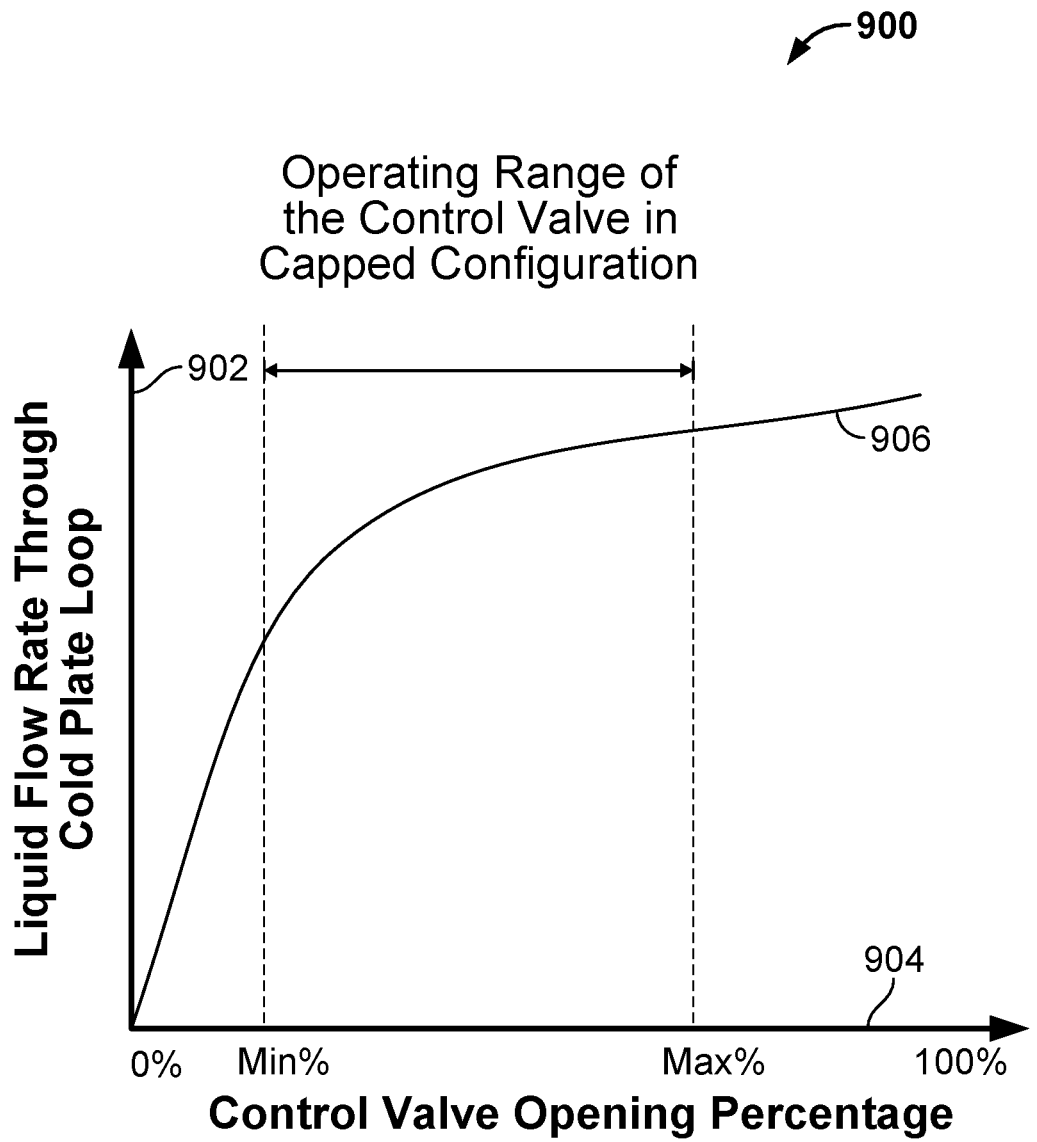
FIG. 9 is a graph that illustrates a relationship between operating variables of the cold plate cooling system according to the operating method of FIG. 8.

FIG. 9 is a graph that illustrates a relationship between operating variables of the cold plate cooling system according to the operating method of FIG. 8. This figure includes graph 900, which shows a relationship between cooling liquid flow rate through the cold plate cooling system on a y-axis 902 and open percentage of control valve 138 on x-axis 904. Thus, as shown, curve 906 shows the relationship between the cooling liquid volumetric flow rate relative to the percent open of the control valve 138. As shown in graph 900, there is a non-linear relationship between flow rate and control valve open percentage.

Figure 10:
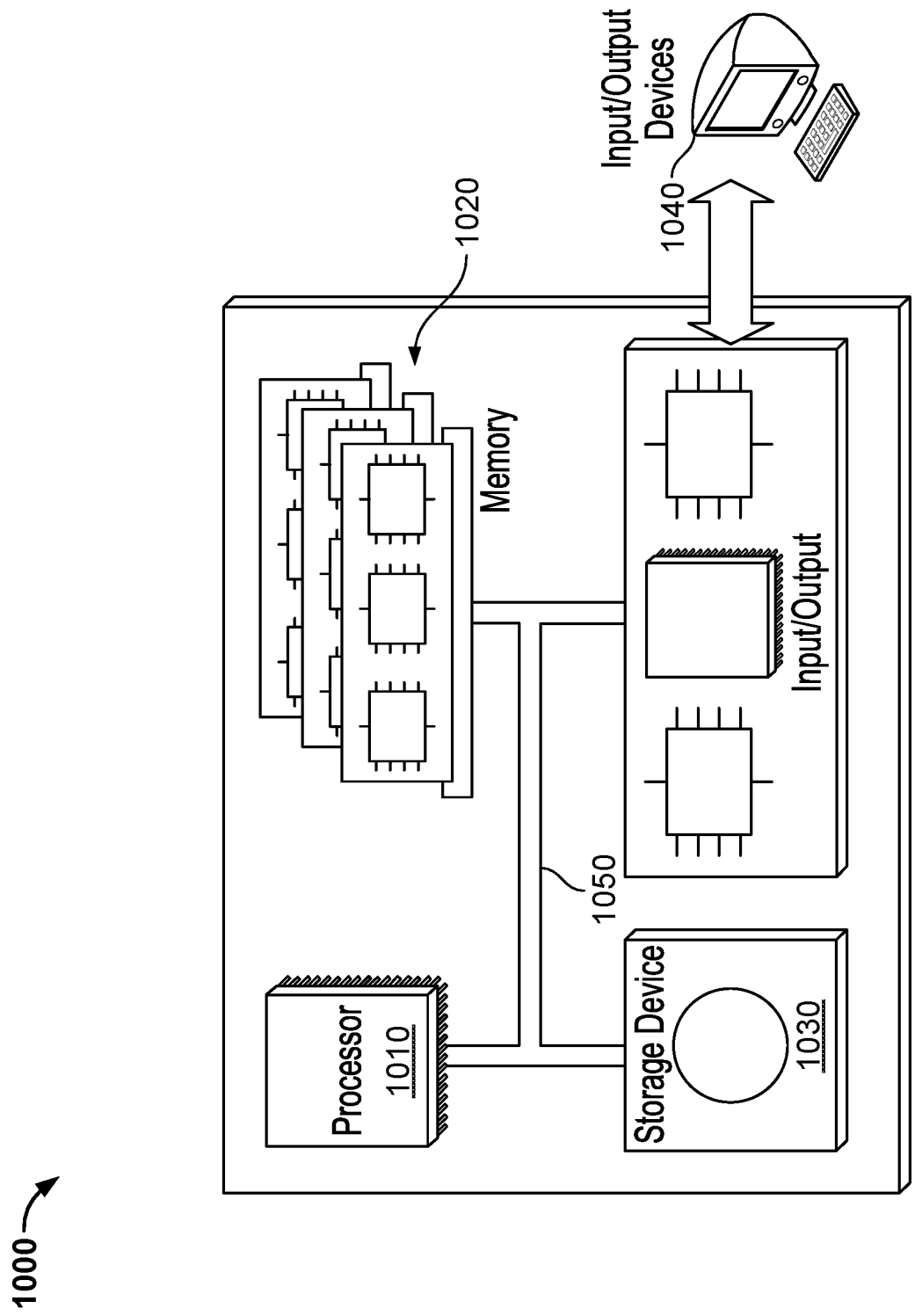
FIG. 10 is a schematic diagram of a control system that can be used for the operations described in association with any of the computer-implemented methods described herein.

FIG. 10 is a schematic diagram of a control system (or controller) 1000. The system 1000 can be used for the operations described in association with any of the computer-implemented methods described previously, for example as or as part of the controller 140 or other controllers described herein. For example, the system 1000 may be used in providing local control for particular ones of or small groups of server rack sub-assemblies, or in providing master control over an entire data center or multiple data centers of such units. Moreover, the system 1000 may describe computing resources that may operate as the loads to be cooled by the systems and methods described above.

The system 1000 is intended to include various forms of digital computers, such as laptops, desktops, workstations, personal digital assistants, servers, blade servers, mainframes, and other appropriate computers. The system 1000 can also include mobile devices, such as personal digital assistants, cellular telephones, smartphones, and other similar computing devices. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The system 1000 includes a processor 1010, a memory 1020, a storage device 1030, and an input/output device 1040. Each of the components 1010, 1020, 1030, and 1040 are interconnected using a system bus 1050. The processor 1010 is capable of processing instructions for execution within the system 1000. The processor may be designed using any of a number of architectures. For example, the processor 1010 may be a CISC (Complex Instruction Set Computers) processor, a RISC (Reduced Instruction Set Computer) processor, or a MISC (Minimal Instruction Set Computer) processor.

In one implementation, the processor 1010 is a single-threaded processor. In another implementation, the processor 1010 is a multi-threaded processor. The processor 1010 is capable of processing instructions stored in the memory 1020 or on the storage device 1030 to display graphical information for a user interface on the input/output device 1040.

The memory 1020 stores information within the system 1000. In one implementation, the memory 1020 is a computer-readable medium. In one implementation, the memory 1020 is a volatile memory unit. In another implementation, the memory 1020 is a non-volatile memory unit.

The storage device 1030 is capable of providing mass storage for the system 1000. In one implementation, the storage device 1030 is a computer-readable medium. In various different implementations, the storage device 1030 may be a floppy disk device, a hard disk device, an optical disk device, or a tape device.

The input/output device 1040 provides input/output operations for the system 1000. In one implementation, the input/output device 1040 includes a keyboard and/or pointing device. In another implementation, the input/output device 1040 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of embodiments have been described. Nevertheless, it will be understood that various modifications may be made without departing from the spirit and scope of what is described. For example, the steps of the exemplary flow charts in FIGS. 4, 7, and 8 may be performed in other orders, some steps may be removed, and other steps may be added. Accordingly, other embodiments are within the scope of the following claims.

What is claimed is:

1. A data center cooling system, comprising:
    a server rack sub-assembly that comprises at least one motherboard mounted on a support member and a plurality of heat generating electronic devices mounted on the at least one motherboard;
    at least one cold plate mounted on top of and positioned in conductive thermal contact with at least a portion of the plurality of heat generating electronic devices, the cold plate configured to receive a flow of a cooling liquid circulated through a supply conduit fluidly coupled to a liquid inlet of the at least one cold plate, through the at least one cold plate, and through a return conduit fluidly coupled to a liquid outlet of the at least one cold plate; and
    a modulating control valve attached to the server rack sub-assembly, the modulating control valve disposed on top of the support member and positioned in either of the supply conduit or the return conduit, the modulating control valve configured to adjust a rate of the flow of the cooling liquid in response to receiving a command from a controller, the command configured to adjust the valve based at least in part on an operating condition of at least one of the plurality of heat generating electronic devices.

2. The data center cooling system of claim 1, wherein the at least one cold plate comprises a plurality of cold plates, each of the plurality of cold plates mounted on top of and positioned in conductive thermal contact with a respective heat generating electronic device of the plurality of heat generating electronic devices.

3. The data center cooling system of claim 2, wherein the supply conduit is directly coupled to each liquid inlet of the plurality of cold plates, and the return conduit is directly coupled to each liquid outlet of the plurality of cold plates.

4. The data center cooling system of claim 2, wherein the supply conduit is directly coupled to the liquid inlet of one of the plurality of cold plates, and the return conduit is directly coupled to the liquid outlet of one of the plurality of cold plates.

5. The data center cooling system of claim 2, wherein the supply conduit is directly coupled to the liquid inlets of two or more of the plurality of cold plates, and the return conduit is directly coupled to the liquid outlets of two or more of the plurality of cold plates.

6. The data center cooling system of claim 1, further comprising a controller communicably coupled to the modulating control valve.

7. The data center cooling system of claim 6, wherein the controller is attached to the server rack sub-assembly.

8. The data center cooling system of claim 6, wherein the controller is configured to perform operations comprising:
    determining a value of the operating condition of the at least one heat generating electronic device; and
    adjusting the modulating control valve to open or close based on the determined value.

9. The data center cooling system of claim 8, wherein determining the value of the operating condition of the at least one heat generating electronic device comprises:
    determining an operating temperature for each of the plurality heat generating electronic devices;
    determining a maximum operating temperature from the determined operating temperatures; and
    calculating a thermal margin between the maximum operating temperature and at least one of the operating temperatures.

10. The data center cooling system of claim 9, wherein adjusting the modulating control valve to open or close based on the determined value comprises adjusting the modulating control valve to open based on the calculated thermal margin greater than a threshold thermal margin value.

11. The data center cooling system of claim 8, wherein determining the value of the operating condition of the at least one heat generating electronic device comprises:
    determining a supply cooling liquid temperature;
    determining a return cooling liquid temperature; and calculating a temperature difference between the supply cooling liquid temperature and the return cooling liquid temperature.

12. The data center cooling system of claim 11, wherein adjusting the modulating control valve to open or close based on the determined value comprises adjusting the modulating control valve to open based on the calculated temperature difference greater than a threshold temperature difference value.

13. The data center cooling system of claim 11, wherein determining a supply cooling liquid temperature comprises receiving a measured temperature value from an inlet temperature sensor in thermal communication with the flow of the cooling liquid through the supply conduit, and determining a return cooling liquid temperature comprises receiving a measured temperature value from an outlet temperature sensor in thermal communication with the flow of the cooling liquid through the return conduit.

14. A method for cooling heat generating devices in a data center, comprising:
circulating a flow of a cooling liquid to a server rack sub-assembly that comprises at least one motherboard mounted on a support member and a plurality of heat generating electronic devices mounted on the at least one motherboard;
circulating the flow of the cooling liquid through a supply conduit to a liquid inlet of at least one cold plate mounted on top of and positioned in conductive thermal contact with at least a portion of the plurality of heat generating electronic devices;
circulating the flow of the cooling liquid through the at least one cold plate to receive heat into the cooling liquid from the portion of the plurality of heat generating electronic devices;
circulating the flow of the heated cooling liquid from a liquid outlet of the at least one cold plate through a return conduit; and
controlling a modulating control valve attached to the server rack sub-assembly and disposed on top of the support member to adjust a rate of the flow of the cooling liquid in response to receiving a command from a controller, the command configured to adjust the valve based at least in part on an operating condition of at least one of the plurality of heat generating electronic devices.

15. The method of claim 14, wherein the at least one cold plate comprises a plurality of cold plates, each of the plurality of cold plates mounted on top of and positioned in conductive thermal contact with a respective heat generating electronic device of the plurality of heat generating electronic devices.

16. The method of claim 15, further comprising:
circulating the flow of cooling liquid directly from the supply conduit to each liquid inlet of the plurality of cold plates; and
circulating the flow of the heated cooling liquid directly from each liquid outlet of the plurality of cold plates to the return conduit.

17. The method of claim 15, further comprising:
circulating the flow of cooling liquid directly from the supply conduit to a liquid inlet of one of the plurality of cold plates;
heating the cooling liquid in the one of the plurality of cold plates;
circulating the flow of the heated cooling liquid from a liquid outlet of the one of the plurality of cold plates to a liquid inlet of another of the plurality of cold plates;
further heating the heated cooling liquid in the another of the plurality of cold plates; and
circulating the flow of the further heated cooling liquid directly from a liquid outlet of the another of the plurality of cold plates to the return conduit.

18. The method of claim 15, further comprising:
circulating the flow of cooling liquid directly from the supply conduit to liquid inlets of a first portion of the plurality of cold plates;
heating the cooling liquid in the portion of the plurality of cold plates;
circulating the flow of the heated cooling liquid from liquid outlets of the first portion of the plurality of cold plates to liquid inlets of a second portion of the plurality of cold plates;
further heating the heated cooling liquid in the second portion of the plurality of cold plates; and
circulating the flow of the further heated cooling liquid directly from liquid outlets of the second portion of the plurality of cold plates to the return conduit.

19. The method of claim 14, further comprising:
determining a value of the operating condition of the at least one heat generating electronic device; and
adjusting the modulating control valve to open or close based on the determined value.

20. The method of claim 19, wherein determining the value of the operating condition of the at least one heat generating electronic device comprises:
determining an operating temperature for each of the plurality heat generating electronic devices;
determining a maximum operating temperature from the determined operating temperatures; and
calculating a thermal margin between the maximum operating temperature and at least one of the operating temperatures.

21. The method of claim 20, wherein adjusting the modulating control valve to open or close based on the determined value comprises adjusting the modulating control valve to open based on the calculated thermal margin greater than a threshold thermal margin value.

22. The method of claim 19, wherein determining the value of the operating condition of the at least one heat generating electronic device comprises:
determining a supply cooling liquid temperature;
determining a return cooling liquid temperature; and
calculating a temperature difference between the supply cooling liquid temperature and the return cooling liquid temperature.

23. The method of claim 22, wherein adjusting the modulating control valve to open or close based on the determined value comprises adjusting the modulating control valve to open based on the calculated temperature difference greater than a threshold temperature difference value.

24. The method of claim 22, wherein determining a supply cooling liquid temperature comprises receiving a measured temperature value from an inlet temperature sensor in thermal communication with the flow of the cooling liquid through the supply conduit, and determining a return cooling liquid temperature comprises receiving a measured temperature value from an outlet temperature sensor in thermal communication with the flow of the cooling liquid through the return conduit.

25. A data center cooling system, comprising:
a server rack sub-assembly that comprises at least one motherboard mounted on a support member and a plurality of heat generating electronic devices mounted on the at least one motherboard;

at least one cold plate positioned in thermal communication with at least a portion of the plurality of heat generating electronic devices, the cold plate configured to receive a flow of a cooling liquid circulated through a supply conduit fluidly coupled to a liquid inlet of the at least one cold plate, through the at least one cold plate, and through a return conduit fluidly coupled to a liquid outlet of the at least one cold plate;

a modulating control valve attached to the server rack sub-assembly and positioned in either of the supply conduit or the return conduit, the modulating control valve configured to adjust a rate of the flow of the cooling liquid based at least in part on an operating condition of at least one of the plurality of heat generating electronic devices; and a controller communicably coupled to the modulating control valve, the controller configured to perform operations comprising:

determining a value of the operating condition of the at least one heat generating electronic device, wherein the determining comprises:

determining an operating temperature for each of the plurality heat generating electronic devices, determining a maximum operating temperature from the determined operating temperatures, and calculating a thermal margin between the maximum operating temperature and at least one of the operating temperatures; and adjusting the modulating control valve to open or close based on the determined value.

26. The data center cooling system of claim 25, wherein the at least one cold plate comprises a plurality of cold plates, each of the plurality of cold plates mounted to a respective heat generating electronic device of the plurality of heat generating electronic devices.

27. The data center cooling system of claim 26, wherein the supply conduit is directly coupled to each liquid inlet of the plurality of cold plates, and the return conduit is directly coupled to each liquid outlet of the plurality of cold plates.

28. The data center cooling system of claim 26, wherein the supply conduit is directly coupled to a liquid inlet of one of the plurality of cold plates, and the return conduit is directly coupled to a liquid outlet of one of the plurality of cold plates.

29. The data center cooling system of claim 26, wherein the supply conduit is directly coupled to liquid inlets of a portion of the plurality of cold plates, and the return conduit is directly coupled to liquid outlets of a portion of the plurality of cold plates.

30. A method for cooling heat generating devices in a data center, comprising:

circulating a flow of a cooling liquid to a server rack sub-assembly that comprises at least one motherboard mounted on a support member and a plurality of heat generating electronic devices mounted on the at least one motherboard;

circulating the flow of the cooling liquid through a supply conduit to a liquid inlet of at least one cold plate positioned in thermal communication with at least a portion of the plurality of heat generating electronic devices;

circulating the flow of the cooling liquid through the at least one cold plate to receive heat into the cooling liquid from the portion of the plurality of heat generating electronic devices;

circulating the flow of the heated cooling liquid from a liquid outlet of the at least one cold plate through a return conduit; and controlling a modulating control valve attached to the server rack sub-assembly to adjust a rate of the flow of the cooling liquid based at least in part on an operating condition of at least one of the plurality of heat generating electronic devices;

determining a value of the operating condition of the at least one heat generating electronic device, the determining comprising:

determining an operating temperature for each of the plurality heat generating electronic devices, determining a maximum operating temperature from the determined operating temperatures, and calculating a thermal margin between the maximum operating temperature and at least one of the operating temperatures; and adjusting the modulating control valve to open or close based on the determined value.

31. The method of claim 30, wherein the at least one cold plate comprises a plurality of cold plates, each of the plurality of cold plates mounted to a respective heat generating electronic device of the plurality of heat generating electronic devices.

32. The method of claim 31, further comprising:

circulating the flow of cooling liquid directly from the supply conduit to each liquid inlet of the plurality of cold plates; and circulating the flow of the heated cooling liquid directly from each liquid outlet of the plurality of cold plates to the return conduit.

33. The method of claim 31, further comprising:

circulating the flow of cooling liquid directly from the supply conduit to a liquid inlet of one of the plurality of cold plates;

heating the cooling liquid in the one of the plurality of cold plates;

circulating the flow of the heated cooling liquid from a liquid outlet of the one of the plurality of cold plates to a liquid inlet of another of the plurality of cold plates;

further heating the heated cooling liquid in the another of the plurality of cold plates; and circulating the flow of the further heated cooling liquid directly from a liquid outlet of the another of the plurality of cold plates to the return conduit.

34. The method of claim 31, further comprising:

circulating the flow of cooling liquid directly from the supply conduit to liquid inlets of a first portion of the plurality of cold plates;

heating the cooling liquid in the portion of the plurality of cold plates;

circulating the flow of the heated cooling liquid from liquid outlets of the first portion of the plurality of cold plates to liquid inlets of a second portion of the plurality of cold plates;

further heating the heated cooling liquid in the second portion of the plurality of cold plates; and circulating the flow of the further heated cooling liquid directly from liquid outlets of the second portion of the plurality of cold plates to the return conduit.

* * * * *